United States Patent
Ren et al.

(10) Patent No.: US 7,586,033 B2
(45) Date of Patent: Sep. 8, 2009

(54) METAL-DOPED SEMICONDUCTOR NANOPARTICLES AND METHODS OF SYNTHESIS THEREOF

(75) Inventors: Zhifeng Ren, Newton, MA (US); Gang Chen, Carlisle, MA (US); Bed Poudel, West Newton, MA (US); Shankar Kumar, Newton, MA (US); Wenzhong Wang, Beijing (CN); Mildred Dresselhaus, Arlington, MA (US)

(73) Assignees: Massachusetts Institute of Technology, Cambridge, MA (US); The Trustees of Boston College, Chestnut Hill, MA (US)

( * ) Notice: Subject to any disclaimer, the term of this patent is extended or adjusted under 35 U.S.C. 154(b) by 607 days.

(21) Appl. No.: 11/120,729

(22) Filed: May 3, 2005

(65) Prior Publication Data

US 2006/0249704 A1    Nov. 9, 2006

(51) Int. Cl.
*C01B 25/14* (2006.01)
*C01B 19/00* (2006.01)
*H01L 35/16* (2006.01)
*H01L 35/22* (2006.01)
*H01L 35/14* (2006.01)

(52) U.S. Cl. ............ 136/239; 136/201; 136/238; 136/236.1; 977/813; 423/508

(58) Field of Classification Search ............ None
See application file for complete search history.

(56) References Cited

U.S. PATENT DOCUMENTS

| | | | |
|---|---|---|---|
| 3,911,469 A * | 10/1975 | Wrobel ............... | 136/264 |
| 5,531,936 A | 7/1996 | Kanatzidis et al. | |
| 5,614,128 A | 3/1997 | Kanatzidis et al. | |
| 5,618,471 A | 4/1997 | Kanatzidis et al. | |
| 5,723,799 A | 3/1998 | Murayama et al. | |
| 5,897,945 A | 4/1999 | Lieber et al. | |
| 5,973,050 A | 10/1999 | Johnson et al. | |
| 6,013,204 A | 1/2000 | Kanatzidis et al. | |
| 6,312,617 B1 | 11/2001 | Kanatzidis et al. | |
| 6,444,896 B1 | 9/2002 | Harman et al. | |
| 6,605,772 B2 | 8/2003 | Harman et al. | |
| 6,670,539 B2 | 12/2003 | Heremans et al. | |
| 2002/0026856 A1 | 3/2002 | Suzuki et al. | |
| 2002/0053359 A1 | 5/2002 | Harman et al. | |
| 2002/0170590 A1 | 11/2002 | Heremans et al. | |
| 2003/0047204 A1 | 3/2003 | Fleurial et al. | |
| 2004/0187905 A1 | 9/2004 | Heremans et al. | |
| 2005/0036938 A1 | 2/2005 | Hyeon | |

FOREIGN PATENT DOCUMENTS

DE    19627389    1/1997

(Continued)

OTHER PUBLICATIONS

Chen et al., "Recent Developments in Thermoelectric Materials," *International Materials Reviews*, vol. 48, p. 45-66, (2003).

(Continued)

*Primary Examiner*—Alexa D Neckel
*Assistant Examiner*—Miriam Berdichevsky
(74) *Attorney, Agent, or Firm*—Thomas J. Engellenner; Reza Mollaaghababa; Nutter McClennen & Fish LLP

(57) ABSTRACT

The present invention generally relates to binary or higher order semiconductor nanoparticles doped with a metallic element, and thermoelectric compositions incorporating such nanoparticles. In one aspect, the present invention provides a thermoelectric composition comprising a plurality of nanoparticles each of which includes an alloy matrix formed of a Group IV element and Group VI element and a metallic dopant distributed within the matrix.

8 Claims, 25 Drawing Sheets

FOREIGN PATENT DOCUMENTS

| JP | 9025526 | 1/1997 |
|---|---|---|
| JP | 2003-251600 | 1/1999 |
| WO | WO 00/12600 | 3/2000 |

OTHER PUBLICATIONS

Hsu et al., "Cubic AgPb$_m$SbTe$_{2+m}$: Bulk Thermoelectric Materials with High Figure of Merit," *Science*, vol. 303, p. 818-821, (Feb. 2004).
Heremans et al., "Thermopower Enhancement in Lead Telluride Nanostructures," *Physical Review*, vol. 70, p. 115334-1-115334-5, (Sep. 2004).
*Science* vol. 271, "Small Clusters Hit the Big Time," 920-922 (Feb. 20, 1996).
Ngiam et al., *J. Appl. Phys.*. "Synthesis of Ge nanocrystals embedded in a Si host matrix," 76, 8201-8203 (1994).
Zhu et al., *J. Appl. Phys.*, "Coexisting photoluminescence of Si and Ge nanocrystals in Ge/Si thin film," 90, 5318-5321 (2001).
Taylor et al., "Solution Synthesis of Germanium Nanocrystals Demonstrating Quantum Confinement," *Chem. Mater.* 10, 22-24 (1998).
Murray et al., "Synthesis and Characterization of Nearly Monodisperse CdE (E=S, Se, Te) Semiconductor Nanocrystallites," *J. Am. Chem. Soc.* 1993, 115, 8706-8715.
Kane et al., *J. Phys. Chem.*, "Theoretical Study of the Electronic Structure of PbS Nanoclusters," 1996, 100, 7928-7932.
Pan et al., "Nanobelts of Semiconducting Oxides," *Science* 2001, 291, 1947-1949.
Ebbesen et al., "Large-scale synthesis of carbon nanotubes," *Nature* 1992, 358, 220-222.
Lao et al., "ZnO Nanobridges and Nanonails," *Nano Lett.* 2003, 3, 235-238.
Li et al., "MoS$_2$ nanoflowers and their field-emission properties," *Appl. Phys. Lett.* 2003, 82, 1962-1964.
Sun et al., "Shape-Controlled Synthesis of Gold and Silver Nanoparticles," *Science* 2002, 298, 2176-2179.
Saito et al., "Carbon nano-cages created as cubes," *Nature* 1998, 392, 237-238.
Maeda et al., "Visible photoluminescence of Ge microcrystals embedded in SiO$_2$ glassy matrices," *Appl. Phys. Lett.* 1991, 59, 3168-3170.
Paine et al., "Visible photoluminescence from nanocrystalline Ge formed by H$_2$ reduction of Si$_{0.6}$Ge$_{0.4}$O$_2$," *Appl. Phys. Lett.* 1993, 62, 2842-2844.
Bettotti et al., "Silicon nanostructures for photonics," *J. Phys.: Condens. Matter* 2002, 14, 8253-8281.
She et al., "*Impact of Crystal Size and Tunnel Dielectric on Semiconductor Nanocrystal Memory Performance,*" *IEEE Trans. Electron Dev.* 2003, 50, 1934-1940.
Bostedt et al., "Evidence for cubic phase in deposited germanium nanocrystals," *J. Phys.: Condens. Matter* 2003, 15, 1017-1028.
Oku et al., "Formation and photoluminescence of Ge and Si nanoparticles encapsulated in oxide layers," *Mater. Sci. Eng. B* 2000, B74, 242-247.
Lin et al., "Structural and optical properties of germanium nanoparticles," *J. Appl. Phys.* 2002, 91, 1525-1528.
Das et al., "Self-assembled Ge nanostructures on polymer-coated silicon: Growth and characterization," *Appl. Phys. Lett.* 2000, 77, 951-953.
Zhu et al., "Enhancement of photoluminescence in Ge nanoparticles by neighboring amorphous C in composite Ge/C thin films," *J. Appl. Phys.* 2003, 93, 6029-6033.
Yang et al., "Sol-Gel Preparation and Photoluminescence of Size Controlled Germanium Nanoparticles Embedded in a SiO$_2$ Matrix," *J. Phys. Chem B* 2003, 107, 13319-13322.
Taylor et al., "Solution Synthesis and Characterization of Quantum Confined Ge Nanoparticles," *Chem. Mater.* 1999, 11, 2493-2500.
Taylor et al., "Solution preparation of Ge nanoparticles with chemically tailored surfaces," *Mater. Sci. Eng. B* 2002, B96, 90-93.
Hope-Weeks, "Time dependent size and shape control of germanium nanocrystals," *Chem. Commun.* 2003, 2980-2981.
Wilcoxon et al., "Synthesis and optical properties of colloidal germanium nanocrystals," *Phys. Rev. B* 2001, 64, 035417-1-035417-9.
Kornowski et al., "nanometer-Sized Colloidal Germanium Particles: Wet-Chemical Synthesis, Laser-Induced Crystallization and Particle Growth," *Adv. Mater.* 1993, 5, 634-636.
Gerion et al., "Solution Synthesis of Germanium Nanocrystals: Success and Open Challenges," *Nano Lett.* 2004, 4, 597-602.
Lu et al., "Synthesis of Germanium Nanocrystals in High Temperature Supercritical Fluid Solvents," *Nano Lett.* 2004, 5 969-974.
Peng et al., "Mechanisms of the Shape Evolution of CdSe Nanocrystals," *J. Am. Chem. Soc.* 2001, 123, 1389-1395.
Pileni, "The role of soft colloidal templates in controlling the size and shape of inorganic nanocrystals," *Nat. Mater.* 2003, 2, 145-150.
Johnson et al., "Growth and form of gold nanorods prepared by seed-mediated, surfactant-directed synthesis," *J. Mater. Chem.* 2002, 12, 1765-1770.
Goldsmid, "*Thermoelectric Refrigeration,*" Plenum Press, New York, 1964.
Chen et al., "Heat Transfer in Nanostructures for Solid-State Energy Conversion," *ASME Journal of Heat Transfer*, 2002, 124, pp. 242-252.
IOFFE, "*Semiconductor Thermoelements and Thermoelectric Cooling,* Infosearch Limited," London, 1957.
Harman et al., "Thermoelectric Quantum-Dot Superlattices with High ZT," *Journal of Electronic Materials*, 29, pp. L1-L4, 2000.
Venkatasubramanian et al., "Thin-film thermoelectric devices with high room-temperature figures of merit," *Nature*, 413, pp. 597-602, 2001.
Hicks et al., "Effect of quantum-well structures on the thermoelectric figure of merit," *Physical Review B*, 47, pp. 12727-12731, 1993.
Hicks et al., "Experimental study of the effect of quantum-well structures on the thermoelectric figure of merit," *Physical Review B*, 53, 10493-10496, 1996.
Koga et al., "Experimental proof-of-principle investigation of enhanced $Z_{3D}$T in (001) oriented Si/Ge superlattices," *Applied Physics Letters*, 77, pp. 1490-1492, 2000.
Springholz et al., "Self-Organized Growth of Three-Dimensional Quantum-Dot Crystals With fcc-Like Stacking and a Tunable Lattice Constant," *Science*, 282, pp. 734-737, 1998.
Chen, "Thermal conductivity and ballistic-phonon transport in the cross-plane direction of superlattices," *Physical Review B.*, 57, pp. 14958-14973, 1998.
Goodson et al., "Heat Conduction in Novel Electronic Films" *Annual Review of Materials Science*, 29, pp. 261-293, 1999.
Venkatasubramanian, "Lattice thermal conductivity reduction and phonon localizationlike behavior in superlattice structures," *Physical Review B*, 61, pp. 3091-3097, 2000.
Song et al., "Thermal conductivity of skutterudite thin films and superlattices," *Applied Physics Letters*, 77, pp. 3854-3856, 2000.
Murray et al., "Synthesis and Characterization of Monodisperse Nanocrystals and Close-Packed Nanocrystal Assemblies," *Annual Review of Materials Science*, 30, pp. 545-610, 2000.
Fang et al., "Nanocrystalline bismuth synthesized via an in situ polymerization-microemulsion process," *Materials Letters*, 42, pp. 113-120, 2000.
Foos et al., "Synthesis of Nanocrystalline Bismuth in Reverse Micelles," *Journal of the American Chemical Society*, 122, pp. 7114-7115, 2000.
Fang et al., "Self-assembled bismuth nanocrystallites," *Chemical Communication*, pp. 1872-1873, 2001.
Mulvaney et al., "Surface Chemistry of Colloidal Gold—Deposition of Lead and Accompanying Optical Effects," *Journal of Physical Chemistry*, 96, pp. 10419-10424, 1992.
Mulvaney et al., "Silica encapsulation of quantum dots and metal clusters," *Journal of Materials Chemistry*, 10, pp. 1259-1270, 2000.
Liz-Marsan et al., "Core-Shell Nanoparticles and Assemblies Thereof," Handbook of Surfaces and Interfaces of Materials edited by H.S. Nalawa, Academic Press, 189-237, 2001.
Lieber, "One-Dimensional Nanostructures: Chemistry, Physics & Applications," *Solid State Communication*, 107, pp. 607-616, 1998.
Morales et al., "A Laser Ablation Method for the Synthesis of Crystalline Semiconductor Nanowires," *Science*, 279, pp. 208-211, 1998.

Wei et al., "Synthesis of Single Crystal Bismuth-Telluride and Lead-Telluride Nanowires for New Thermoelectric Materials," MRS Proc., V. 581, pp. 219-223, 2000.

Gudiksen et al., "Growth of nanowire superlattice structures for nanoscale photonics and electronics," *Nature*, 415, pp. 617-620, 2002.

Wu et al., "Block-by-Block Growth of Single-Crystalline Si/SiGe Superlattice Nanowires," *Nanoletters*, 2, pp. 83-86, 2002.

Zhang et al., "Processing and Characterization of Single-Crystalline Ultrafine Bismuth Nanowires," *Chemistry of Materials*, 11, pp. 1659-1665, 1999.

Heremans et al., "Bismuth nanowire arrays: Synthesis and galvanomagnetic properties," *Physical Review B*, 61, pp. 2921-2930, 2000.

Sapp et al., "Template Synthesis of Bismuth Telluride Nanowires," *Advanced Materials*, 11, pp. 402-404, 1999.

Prieto et al., "Electrodeposition of Ordered $Bi_2Te_3$ Nanowire Arrays," *Journal of the American Chemical Society*, 123, pp. 7160-7161, 2001.

Takahashi et al., "Electrodeposition of PBS Films From Acidic Solution," *Journal of Electroanalytical Chemistry*, 359, pp. 281-286, 1993.

Molin et al., "Electrochemical deposition of PbSe thin-films from aqueous-solutions," *Thin Solid Films*, 265, pp. 3-9, 1995.

Saloniemi et al., "Electrodeposition of lead selenide thin films," *Journal of Materials Chemistry*, 8, pp. 651-654, 1998.

Saloniemi et al., "Electrodeposition of PbTe thin films," *Thin Solid Films*, 326, pp. 78-82, 1998.

Routkevitch et al., "Nonlithographic Nano-Wire Arrays: Fabrication, Physics, and Device Applications," *IEEE Transactions on Electron Devices*, 43, pp. 1646-1658, 1996.

Ren et al., "Synthesis of Large Arrays of Well-Aligned Carbon Nanotubes on Glass," *Science* 282, pp. 1105-1107, 1998.

Rowe, D.M., Ed., *Handbook of Thermoelectrics*, CRC Press, Boca Raton, Florida, 1995.

Yang et al., "Geometric Effects on the Transient Cooling of Thermoelectric Coolers," *MRS Proc.*, vol. 691, pp. G8.27.1-G8.27.6 (2002).

Jacquot et al., "Fabrication and Modeling of a Thermoelectric Microgenerator," $21^{21}$ International Conference on Thermoelectroncis, pp. 561-564 (2002).

Chen, G., "Size and Interface Effects on Thermal Conductivity of Superlattices and Periodic Thin-Film Structures," *ASME Journal of Heat Transfer*, vol. 119, pp. 220-229, 1997.

Yang et al., Lattice Dynamics Study of Anisotropic Heat Conduction in Superlattices, *Microscale Thermophysical Engineering*, vol. 5, pp. 107-116, 2001.

Mrotzek et al., "Search for New Thermoelectric Materials through Exploratory Solid State Chemistry. The Quaternary Phases $A_{1+x}M_{3-2x}Bi_{7+x}Se_{14}, A_{1-x}M_{3-x}Bi_{11+x}Se_{20}, A_{1-x}M_{4-x}Bi_{11+x}SE_{21}$ and $A_{1-x}M_{5-x}Bi_{11+x}Se_{22}$ (A=K, Rb, Cs, M=Sn, Pb) and the Homologous Series $A_m[M_6Se_8]m[M_{5+n}Se_{9+n}]$" *MRS Proceedings*, 691, pp. G.5.1.1-G.5.1.12 (2001).

Ghamaty et al., "Thermal and Electrical Properties of $Si/Si_{0.8}Ge_{0.2}$ and $B_4C/B_9C$ Films," *Proc.* ICT98, pp. 206-209.

Bennett, G.L., "Space Applications, in CRC Handbook of Thermoelectrics," Ed.D.M. Rowe, CRC Press, Boca Raton, pp. 515-537 (1995).

Kanatzidis, M.G., "New Bulk Materials for Thermoelectric Applications: Synthetic Strategies Based on Phase Homologies," Michigan State University (2003).

Borca-Tasciuc et al., "Thermal conductivity of symmetrically strained Si/Ge superlattices," *Superlattices and Microstructures*, vol. 28, pp. 119-206 (2000).

Koga et al., "Mechanism of the enhanced thermoelectric power in (111)-oriented *n*-type $PbTe/Pb_{1-x}Eu_xTe$ multiple quantum wells," *Phys. Rev. B.*, 1999, 60, 14286-14293.

Vining, C.B., "Silicon Germanium," in CRC Handbook of Thermoelectrics, ed. Rowe, D.M., CRC Press, Boca Raton, pp. 328-337 (1995).

Scoville et al., "Thermal Conductivity Reduction in SiGe Alloys by the Addition of Nanophase Particles," *Nanostructured Materials*, 5, 207-23, 1995.

Rowe et al., "Comments on the thermoelectric properties of pressure-sintered $Si_{0.8}Ge_{0.2}$ thermoelectric alloys," *Journal of Applied Physics*, v. 73, pp. 4683-4685 (1993).

Harman et al., "Quantum Dot Superlattice Thermoelectric Materials and Devices," *Science* 297, pp. 2229-2232 (2002).

Sun et al., "Experimental Study of the Effect of the Quantum Well Structures on the Thermoelectric Figure of Merit in $Si/Si_xGe_{l-x}$ System," Proceedings of Int. Conf. Thermoelectrics, ICT'99, pp. 652-655 (1999).

Morup et al., "Crystal growth and the steady-state grain size during high-energy ball-milling," *Europhysics Letters*, 56, pp. 441-446 (2001).

Lam et al., "Large-scale synthesis of ultrafine Si nanoparticles by ball milling," *Journal of Crystal Growth*, 220, pp. 466-470 (2000).

Lao et al., "Hierarchical ZnO Nanostructures," Nano letters, pp. 1287-1291 (2002).

Lai et al., "Melting point depression of Al clusters generated during the early stages of film growth: Nanocalorimetry measurements," *Applied Physics Letters*, 72, pp. 1098-1100 (1998).

Lu et al., "Melting and superheating of low-dimensional materials," Current Opinion in Solid State and Materials Science, 5, pp. 39-44 (2001).

Yang et al., "Measurement of anisotropic thermoelectric properties in superlattices," *Applied Physics Letters*, 81, pp. 3588-3590 (2002).

Lin et al., "Semimetal-semiconductor transition in $Bi_{l-x}Sb_x$ alloy nanowires and their thermoelectric properties," *Applied Physics Letters*, 81, pp. 2403-2405 (2002).

Borca-Tasciuc et al., "Thermal Conductivity of InAs/AlSb Superlattices," Microscale Thermophysical Engineering, 5, pp. 225-231 (2001).

Venkatasubramaniam, R., Siivola, E., Colpitts, T., O'Quinn, B., *Nature*, 2001, *413*, 597.

Harman, T.C., Taylor, P.J., Walsh, M.P., LaForge, B.E., *Science*, 2002, *297*, 2229.

Shchennikov, V. V., Ovsyannikov, S. V., *Solid State Commun.*, 2004, *126*, 373.

Ovsyannikov, S.V., Shchennikov, V.V., Ponosov, Y.S., Gudina, S. V., Guk, V.G., Skipetrov, E.P., Mogilenskikh, V.E., *J. Phys. D: Appl. Phys.*, 2004, *37*, 1151.

Hsu, K.F., Loo, S., Guo, F., Chen, W., Dyck, J.S., Uher, C., Hogan, T., Polychroniadis, E.K., Kanatzidis, M.G., *Science*, 2004, *303*, 818.

Hicks, L. D., Dresselhaus, M.S., *Phys. Rev. B*, 1993, *47*, 12727.

Hicks, L. D., Dresselhaus, M.S., *Phys. Rev. B*, 1993, *47*, 16631.

Harman, T.C., Taylor, P.J., Spears, D.L., Walsh, M.P., *J. Electron. Mater.*, 2000, *29*, L1-L4.

Hicks, L.D., Harman, T.C., Sun, X., Dresselhaus, M.S., *Phys. Rev. B* 1996, *53*, R10493.

Gou, L.F., Murphy, C.J., *Nano Lett.*, 2003, 231-234.

Caruso, F., Caruso, R.A., Mohwald, H., *Science*, 1998, *282*, 1111.

Goltner, C.G., *Angew. Chem.*, 1999, *111*, 3347; *Angew. Chem. Int. Ed.*, 1999, *38*, 3155.

Sun, Y., Xia, Y., *Science*, 2002, *298*, 2716.

Sun, Y., Mayers, B., Xia, Y., *Adv. Mater.*, 2003, *15*, 641.

Dinsmore, A.D., Hsu, M.F., Nikolaides, M.G., Marquez, M., Bausch, A.R., Weitz, D.A., *Science*, 2002, *298*, 1006.

Caruso, F., Shi, X.Y., Caruso, R.A., Susha, A., *Adv. Mater.*, 2001, *13*, 740.

Breen, M.L., Dinsmore, A.D., Pink, R.H., Qadri, S.Q., *Langmuir*, B.R., 2001, *17*, 903.

Kim, S.W., Kim, M., Lee, W.Y., Hyeon, T., *J. Am. Chem. Soc.*, 2002, *124*, 7642.

Dia, Z., Dahne, L., Mohwald, H., Tiersch, B., *Angew. Chem. Int. Ed.*, 2002, *41*, 4019.

Yang, Z., Niu, Z., Lu, Y., Hu, Z., Han, C.C., *Angew. Chem. Int. Ed.*, 2003, *42*, 1943.

Zhu, J.J., Xu, S., Wang, H., Zhu, J.M., Chen, H.Y., *Adv. Mater.*, 2003, *15*, 156.

Kobayashi, S., Hamasaki, N., Suzuki, M., Kimura, M., Shirai, H., Hanabusa, K., *J. Am. Chem. Soc.*, 2002, *124*, 6550.

Collins, A.M., Spickermann, C., Mann, S., *J. Mater. Chem.*, 2003, *13*, 1112.

Blin, J.L., Leonard, A., Yuan, Z.Y., Gigot, L., Vantomme, A., Cheetham, A.K., Su, B.L., *Angew. Chem. Int. Ed.*, 2003, *42*, 2872.

Yuan, Z.Y., Ren, T.Z., Su, B.L., *Adv. Mater.*, 2003, *15*, 1462.

Deng, Y., Nan, C.W., Wei, G.D., Guo, L., Lin, Y.H., *Chem. Phys. Lett.*, 2003, *374*, 410.

Cao, M.H., Wang, Y.H., Guo, C.X., Qi, Y.J., Hu, C.W., Wang, E.B., *J. Nanosci. Nanotec.*, 2004, *4*, 824.

Yu, D.B., Yam V.W.W., *J. Am. Chem. Soc.*, 2004, *126*, 13200.

Hu, J.S., Guo, Y.G., Liang, H.P., Wan, L.J., Bai, C.L., Wang, Y.C., *J. Phys. Chem. B* 2004, *108*, 9734.

Pileni, M.P., *Nature Mater.*, 2003, *2*, 145.

Tianhao Ji et al., "The First Synthesis $Pb_{1-x}Mn_xSe$ Nanocrystals", *J. Am. Chem. Soc.*, 125:8448-9, 2003.

Jian Yang et al., "A New Solvothermal-Reduction to Pathway Nanocrystalline MTe (M=Zn, Pb)", *Chemistry Letters*, 8:839-840, 1999.

B. Poudel et al., "Shape Evolution of Lead Telluride and Selenide Nanostructures Under Different Hydrothermal Synthesis Conditions", *J. Nanosci. Nanotechnol*, 6(4):1050-3, 2006.

\* cited by examiner

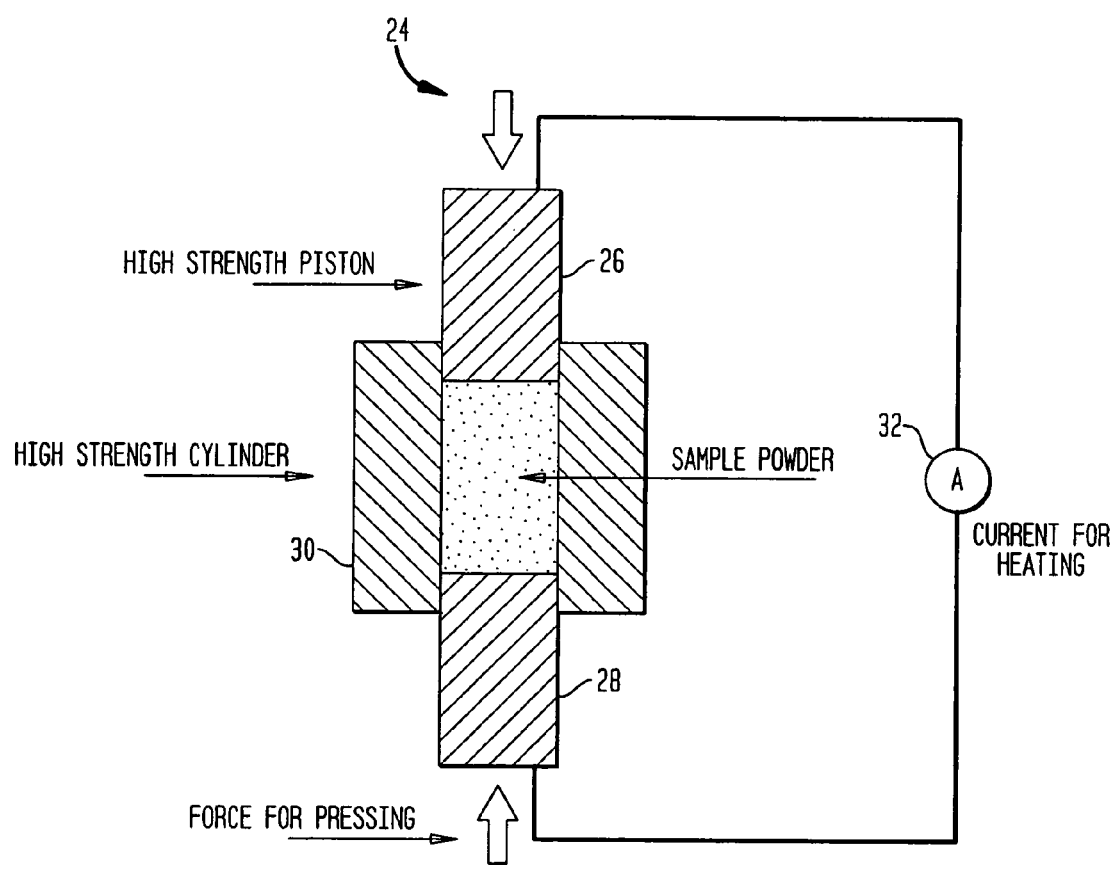

US 7,586,033 B2

METAL-DOPED SEMICONDUCTOR NANOPARTICLES AND METHODS OF SYNTHESIS THEREOF

STATEMENT REGARDING FEDERALLY SPONSORED RESEARCH OR DEVELOPMENT

The U.S. Government has rights in this invention pursuant to contract Nos. 5000486 and NAS3-03108 awarded by the National Aeronautics and Space Administration (NASA), grant No. NIRT 0304506 awarded by the National Science Foundation (NSF), and grant No. DE-FG02-00ER45805 awarded by the Department of Energy (DOE).

BACKGROUND OF THE INVENTION

The present invention is generally directed to micro and nano-sized particles formed of semiconductor compounds, thermoelectric compositions formed of such particles, and methods for their synthesis.

Group IV-VI binary semiconductor materials are currently of interest for use in thermoelectric applications, such as power generation and cooling. For example, PbTe-based compounds can be used in solid-state thermoelectric (TE) cooling and electrical power generation devices. A frequently utilized thermo-electric figure-of-merit of a thermoelectric device is defined as $$Z = \frac{S^2 \sigma}{k},$$

where S is the Seebeck coefficient, σ is the electrical conductivity, and k is thermal conductivity. In some cases, a dimensionless figure-of-merit (ZT) is employed, where T can be an average temperature of the hot and cold sides of the device. It has also been suggested that nanostructured materials can provide improvements in a thermoelectric figure-of-merit of compositions incorporating them.

Accordingly, there is a need for methods of synthesizing nanostructured semiconductors from Group IV-VI materials. There is also a need for such synthetic methods that provide high yields and can be readily implemented. Moreover, there is a need for improved IV-VI micro and nanostructures that would exhibit enhanced thermoelectric properties.

SUMMARY OF THE INVENTION

The present invention generally relates to binary or higher order semiconductor nanoparticles doped with a metallic element, and thermoelectric compositions incorporating such nanoparticles. In one aspect, the present invention provides a thermoelectric composition comprising a plurality of nanoparticles each of which includes an alloy matrix formed of a Group IV element and Group VI element and a metallic dopant distributed within the matrix.

The terms "nanoparticles" and "nanostructures," which are employed interchangeably herein, are known in the art. To the extent that any further explanation may be needed, they primarily refer to material structures having sizes, e.g., characterized by their largest dimension, in a range of a few nanometers (nm) to about a few microns. Preferably, such nanoparticles have sizes in a range of about 10 nm to about 200 nm (e.g., in a range of about 5 nm to about 100 nm). In applications where highly symmetric structures are generated, the sizes (largest dimensions) can be as large as tens of microns.

In a related aspect, the metallic dopant can have a relative atomic concentration less than about 20 percent, for example, in a range of about 1 percent to about 20 percent. The dopant can be any suitable metal, such as copper, silver, zinc, gold, gallium, indium, thallium, tin, antimony, or bismuth.

In another aspect, the alloy matrix can be formed of PbTe or PbSe containing a uniform or a non-uniform distribution of the metallic dopant. For example, in one embodiment, the nanoparticle can be characterized by the following chemical formula: $Cu_x(PbTe)_{1-x}$, wherein x can be in a range of about 0.01 to about 0.2. In another embodiment, the nanoparticle can be characterized by the following chemical formula: $Ag_x(PbTe)_{1-x}$, wherein x can be in a range of about 0.01 to about 0.2. In other embodiments, the nanoparticle can be any of $Zn_x(PbTe)_{1-x}$, $Au_x(PbTe)_{1-x}$, $Ga_x(PbTe)_{1-x}$, $In_x(PbTe)_{1-x}$, $Tl_x(PbTe)_{1-x}$, $Sn_x(PbTe)_{1-x}$, $Sb_x(PbTe)_{1-x}$ and $Bi_x(PbTe)_{1-x}$, where x can be in a range of about 0.01 to about 0.2

In another aspect, the present invention provides a thermoelectric composition that comprises a plurality of nano-sized structures each of which includes a lattice composed of atoms of a Group IV element and atoms of a Group VI element forming chemical bonds with one another, and one or more metallic domains distributed uniformly or non-uniformly within the lattice. The metallic dopant can be formed, for example, of silver or copper or any other suitable metal, such as those recited above, and can comprise less than about 20 atomic percent of the structure, e.g., about 1 atom percent to about 20 atom percent of the nanostructure.

In another aspect, the invention provides a thermoelectric composition having a plurality of nano-sized crystalline structures each comprising a portion formed of a Group IV-Group VI alloy and one or more metallic domains surrounded by the alloy portion. The nano-sized crystalline structures can have sizes in a range of about 5 nm to about 1000 nm, and more preferably in a range of about 10 nm to about 200 nm, e.g., in a range of about 5 nm to about 100 nm. Further, the metallic domains can have average sizes of a few nanometers (e.g., 1-50 nm).

In another aspect, the invention provides a nanoparticle that includes a matrix formed as an alloy of a Group IV element, such as Pb, a Group VI element, such as Se, and a metal, and one or more domains formed of the metal and distributed, e.g., non-uniformly, within the alloy matrix. The nanoparticle can have a largest dimension in a range of about a few nanometers to about 1000 nanometers, e.g., in a range of about 5 nm to about 100 nm. Some examples of suitable metals include, e.g., silver, copper, zinc, gold, gallium, indium, thallium, tin, antimony and bismuth.

In another aspect, the invention provides a method of synthesizing nanoparticles having a metallic dopant by preparing a solution containing a surfactant (e.g., PEG), a reagent having a Group IV element (e.g., Pb) and a reagent having a Group VI element (e.g., Se). A quantity of a reagent containing a metal (e.g., silver or copper) and a reducing reagent can be added to the solution. The resultant solution can then be maintained at an elevated temperature in a range of about 20° C. to about 360° C. for a duration in a range of about 1 hour to about 50 hours (e.g., in a range of about 5 hours to about 30 hours) to generate a reaction product including nanoparticles of the Group IV-VI elements doped with the metal. The above reagents can be substances, e.g., in the elemental form or as compounds, that can provide sources of Group IV and Group VI elements and a metal of interest. It should be understood that the above steps for generating the resultant solution to be maintained at an elevated temperature can be performed in any order, or simultaneously.

In a related aspect, a base (e.g., NaOH) can be added to the solution so as to facilitate formation of the nanoparticles.

Further understanding of the invention can be obtained by reference to the following detailed description in conjunction with the drawings, which are described briefly below.

BRIEF DESCRIPTION OF THE DRAWINGS

FIG. 2 is a schematic diagram of a plasma compaction apparatus to compact IV-VI nanostructures generated in accordance with the teachings of the invention.

DETAILED DESCRIPTION

The present invention generally relates to micro and nanostructures formed of Group IV-Group VI compounds and methods of their synthesis, and to thermoelectric compositions formed by employing these structures. In some embodiments, these IV-VI structures can include metallic dopants that can further enhance the thermoelectric properties of compositions formed of these structures.

Figure 1:
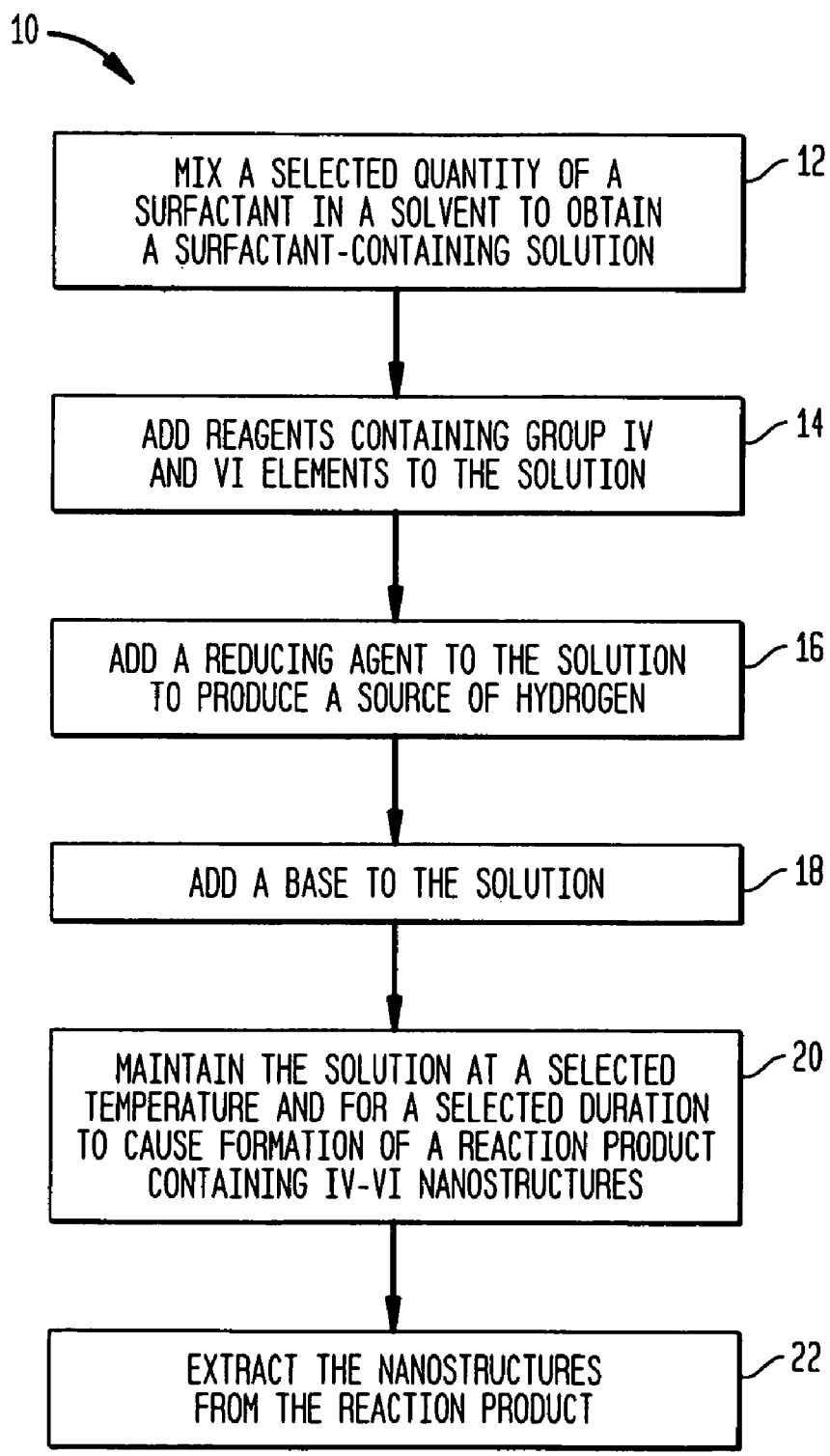
FIG. 1 is a flow chart indicating various steps for synthesizing IV-VI nanostructures in accordance with one embodiment of the invention.

With reference to a flow chart 10 of FIG. 1, in an exemplary method for synthesizing nanoparticles in accordance with one embodiment of the invention, in a step 12, a selected quantity of a surfactant is mixed in a solvent to obtain a surfactant-containing solution. Surfactants generally refer to amphiphilic molecules in which part of the molecule is hydrophilic and another part is hydrophobic. Some examples of suitable surfactants include, without limitation, polyethyleneglycol (PEG), hexadecyltrimethylammonium bromide (CTAB) and tergitol NP-9. The concentration of the surfactant can be selected based on factors such as the desired average sizes and the shapes of nanoparticles generated in the subsequent steps. For example, in many embodiments, the surfactant concentration can be in a range of about 0.001 to about 0.1 molar. The solvent can be polar or non-polar. While in embodiments described below water is employed as the solvent, in other embodiments, other solvents such as alcohol, a mixture of water and alcohol, or hexane can be also utilized.

In step 14, a reagent having a Group IV element and another reagent having a Group VI element are added to the solution. In some embodiments, these reagents can be salts containing either a Group IV element or a Group VI element. Alternatively, the reagents can be powders of such elements. Some examples of suitable reagents include, without limitation, lead acetate, lead chloride, lead sulfate, and $NaSeO_3$. Those having ordinary skill in the art will appreciate that other compounds having a desired Group IV or Group VI element can also be employed.

With continued reference to the flow chart 10, in step 16, a reducing agent is added to the solution to provide a source of hydrogen atoms. Some examples of suitable reducing agents include, without limitation, hydrazine hydrate, sodium borohydride ($NaBH_4$). In many embodiments, a base, such as sodium hydroxide (NaOH) is also added (step 18) to the solution to facilitate reaction of Group IV and Group VI elements to generate the desired nanoparticles. It should be understood that the above steps can be performed in any sequence. In addition, two or more of the steps can be performed simultaneously. In general, the various compounds described are added and mixed within the solvent in quantities that allow their dissolution therein.

In step 20, the resultant solution can be maintained at a temperature and for a duration sufficient to allow formation of a reaction product containing IV-VI nanostructures. For example, in some embodiments, the solution can be maintained at an elevated temperature, e.g., a temperature in a range of about 20° C. to about 360° C., for a sufficient duration to allow chemical reactions occurring within the solution to cause generation of nanoparticles containing the Group IV and Group VI elements. For example, the solution can be transferred into a pressure vessel and placed within a furnace to raise its temperature to a desired elevated value. The solution can be maintained at this elevated temperature for a time duration in a range of about one hour to about 50 hours, or in a range of about 10 hours to about 30 hours, to cause formation of the nanoparticles. In other embodiments, the solution can be kept at a lower temperature, e.g., in a range from room temperature to about 60° C., to allow chemical reactions for generating the nanoparticles to occur.

Subsequently, in step 22, the nanoparticles can be extracted from the resultant reaction product. For example, in some embodiments, the reaction product is centrifuged, washed, e.g., with distilled water to remove byproducts, and a powder precipitate containing the nanoparticles is collected. In some embodiments, the powder containing the nanoparticles can be dried under vacuum and packed in an inert atmosphere (e.g., in a Glove Box under in an argon environment). The packing of the nanoparticles in an inert atmosphere can advantageously inhibit formation of oxide layers around the nanoparticles, which can adversely affect the thermoelectric properties of a thermoelectric composition generated from the nanoparticles in subsequent processing steps, as discussed further below.

In some embodiments, the synthesized nanoparticles can be compacted (densified) at an elevated temperature and under compressive pressure to generate a thermoelectric composition. By way of example, a plasma pressure compaction apparatus 24, shown schematically in FIG. 2, can be employed for this purpose. The exemplary apparatus 24 includes two high strength pistons 26 and 28 that can apply a high compressive pressure, e.g., a pressure in a range of about 100 to about 1000 MegaPascals (MPa), to a sample of nanoparticles, generated as described above, that is disposed within a high strength cylinder 30 while a current source 32 applies a current through the sample for heating thereof. In many embodiments, the current density is in a range of about 500 A/cm$^2$ to about 3000 A/cm$^2$. The temperature of the sample (or an estimate thereof) can be obtained by measuring the temperature of the cylinder via an optical pyrometer (not shown) or a thermocouple attached to the sample surface. The temporal duration of the applied pressure and current is preferably selected so as to compact the nanoparticles while inhibiting formation of larger particle sizes as a result of merger of two or more of the nanoparticles (herein also referred to as nanocrystals when in crystalline form).

The above synthesis methods for generating binary IV-VI nanostructures provide a number of advantages. For example, they can provide a high yield (e.g., kilograms per day) of the nanostructures. Further, various reaction parameters, such as temperature, surfactant concentration and the type of solvent, can be readily adjusted to vary the size and morphology of the synthesized nanostructures, as discussed further below.

To further elucidate the teachings of the invention and only for illustrative purposes, the synthesis of PbTe and PbSe nanoparticles in accordance with two embodiments of the invention are described below. It should, however, be understood that the teachings of the invention can be utilized to synthesize other Group IV-Group VI nanostructures.

By way of example, PbTe nanocrystals were prepared by mixing 50 milligrams (mg) of a surfactant (polyethylene glycol (PEG) with a molecular weight of 20,000) with 50 milliliters (mL) of water to obtain a surfactant-containing aqueous solution. 2.4 grams of NaOH (a base) pellets were added to the solution to obtain an NaOH molar concentration of 1.2 in the solution. Tellerium (Te) powder and lead acetate, each with a concentration of 1 mMol, were added to the solution while continuously stirring it. This was followed by adding about 5 mL of hydrazine hydrate (a reducing agent) to the solution and transferring the solution into a pressure vessel (125 mL capacity). The vessel was placed in a furnace to maintain the temperature of the solution at about 160° C. for about 20 hours. Subsequently, the reaction product was washed with distilled water to strip off byproducts from the synthesized PbTe nanoparticles.

Figure 3A:
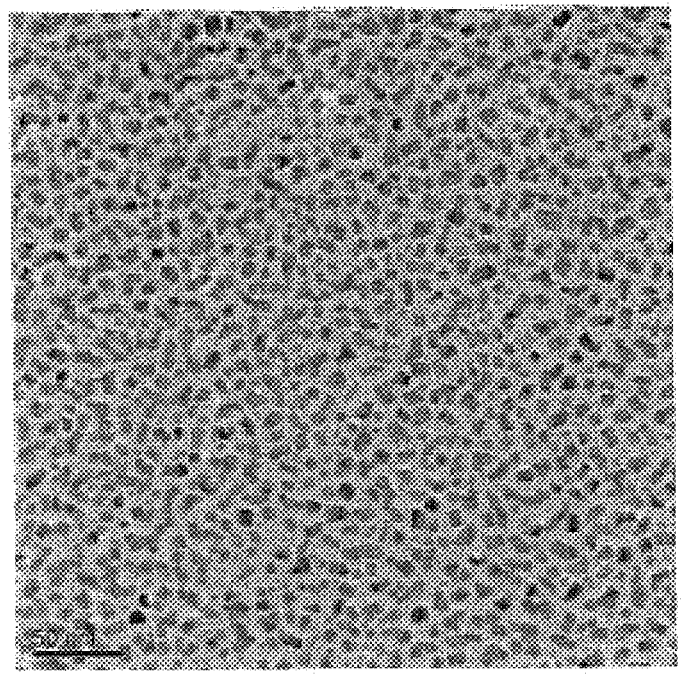
FIGS. 3A and 3B present low magnification TEM images of prototype PbTe nanocrystals synthesized in accordance with one embodiment of the invention.
Figure 3B:
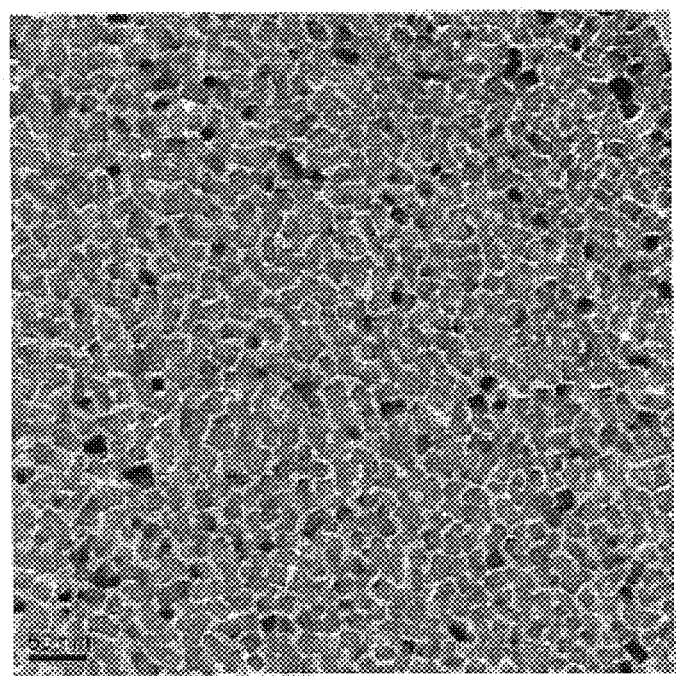
Figure 4A:
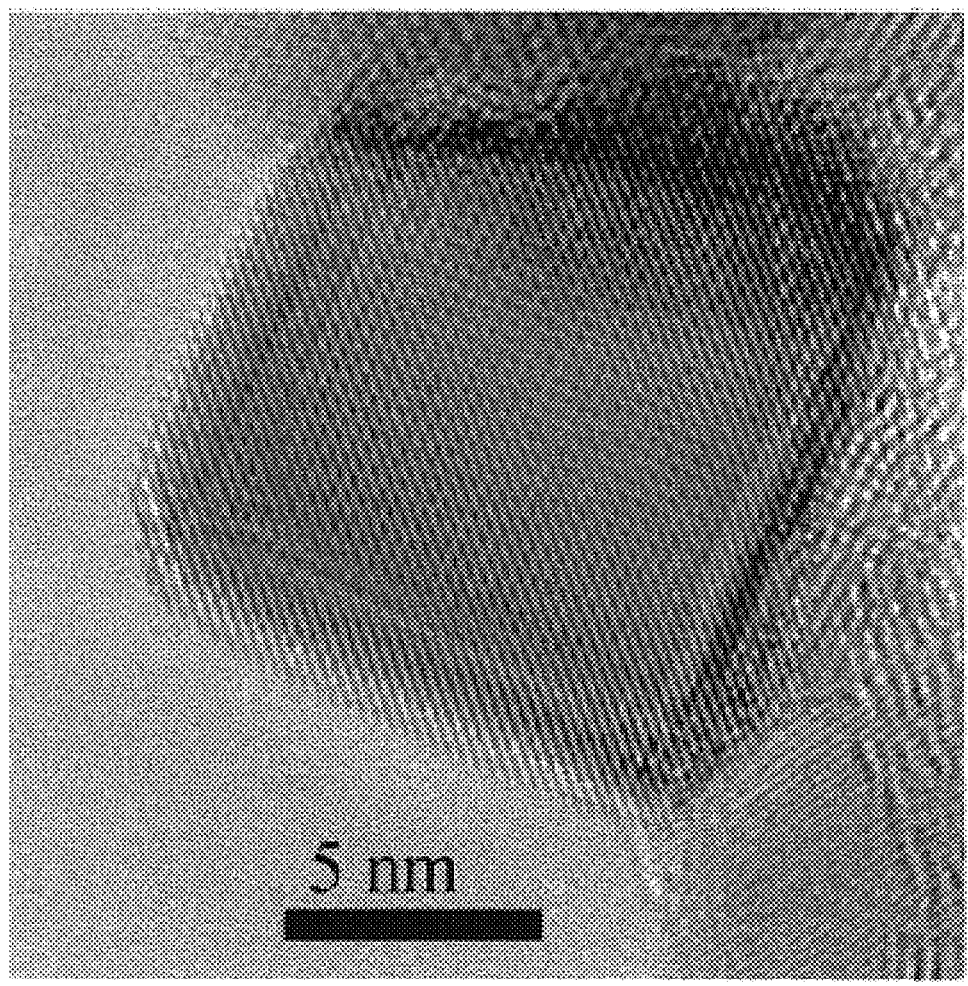
FIGS. 4A-4C show high resolution TEM images of prototype PbTe nanocrsytals whose low resolution images are shown in FIG. 3A and 3B.
Figure 4B:
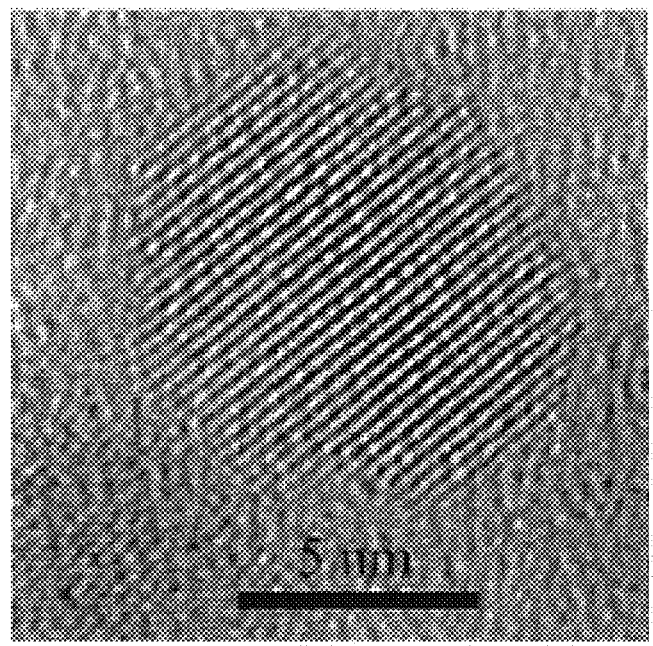
Figure 4C:
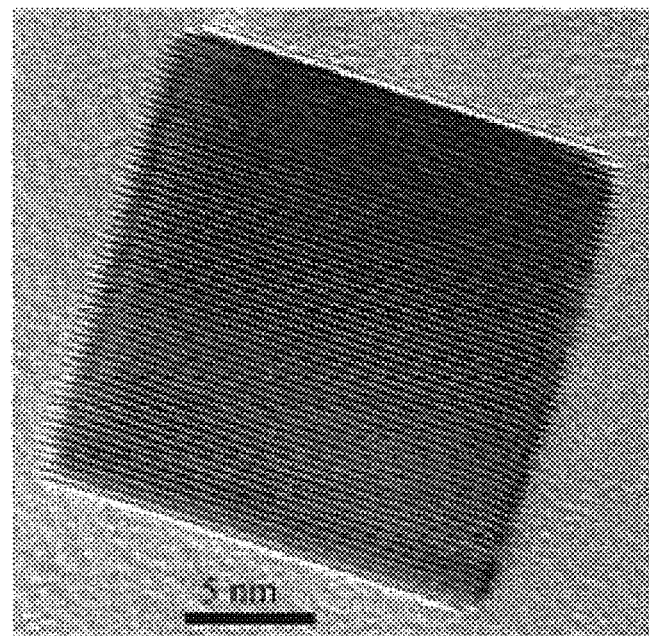

The generated PbTe nanocrystals (herein also referred to as PbTe nanopowder) were then examined by employing transmission electron microscopy (TEM), scanning electron microscopy (SEM) and x-ray diffractometry (XRD). By way of example, FIGS. 3A and 3B show low magnifcation TEM images of the PbTe nanocrystals, illustrating that the nanocrystals exhibit diameters in a range of about 5 nm to about 40 nm. Further, FIGS. 4A-4C show high resolution TEM images of the PbTe nanocrystals. These images show that the PbTe nanocrystals have a high degree of crystallinity and are free of amorphous oxide layers surrounding their outer surfaces. The lack of oxide layers is particularly advantageous because such layers could significantly degrade the electrical conductivity, and hence the figure-of-merit, of thermoelectric compositions fabricated by employing the nanoparticles.

Figure 5:
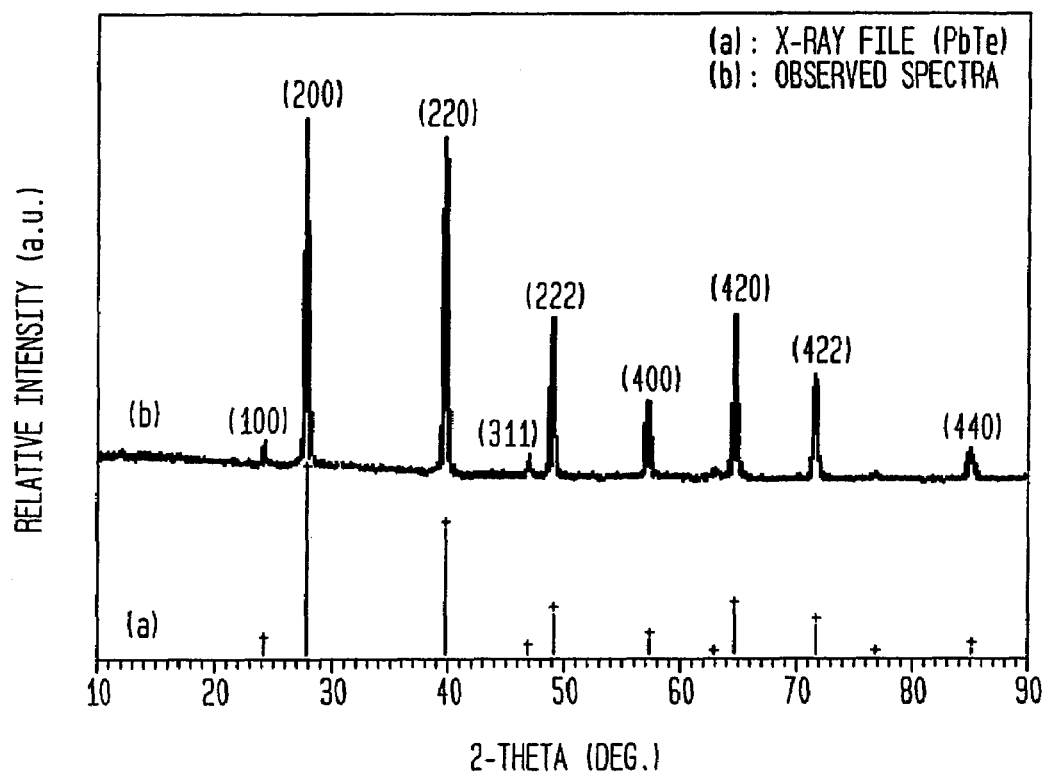
FIG. 5 depicts an X-ray diffraction spectrum of the prototype PbTe nanocrystals whose images are shown in the above FIGS. 3A-3B and 4A-4C.

A comparison of an X-ray diffraction (XRD) spectrum of the PbTe nanocrystals with a corresponding standard spectrum of PbTe, both of which are presented in FIG. 5, shows that all the peaks in the nanocrystals spectrum can be indexed to a PbTe alloy having face center cubic (FCC) structure with a lattice constant of 0.646 nm (a=0.646 nm). No peaks corresponding to other phases were detected, thus exhibiting the high purity of the synthesized PbTe nanoparticles. An average particle size of about 30 nm, calculated by employing the x-ray pattern and the well-known Debye-Scherrer formula is consistent with values discerned from the TEM images.

As noted above, a surfactant (PEG) was employed in the synthesis of the PbTe nanoparticles. It was discovered that in the absence of the surfactant, the average particle size would increase and the crystalline quality of the nanoparticles would degrade. It was also discovered that the surfactant molecules advantageously inhibit the growth of circumferential oxide layers when the solution is exposed to air, presumably by acting as capping agents during nanocrystal growth.

Table 1 below presents measured thermoelectric properties of prototype samples prepared by compacting, via hot press, PbTe nanopowders synthesized by employing the above methods as well as the corresponding properties of compositions obtained by compacting PbTe micropowders (powder of micron-sized PbTe particles). The compaction of the powders was achieved by utilizing a plasma pressure compaction process performed at an elevated temperature in a range of about 700° C. to about 900° C. under moderate pressure (100-200 MPa).

TABLE 1

| Sample | Hot Pressed Temp (C.) | Holding Pressure (MPa) Time (min) | Particle Size | Density (g/cm$^3$) | Thermal Cond.(W/mK) | Seebeck Coeff. (μV/K) | Electrical Cond. (S/m) | Power Factor | Temp (K) | ZT |
|---|---|---|---|---|---|---|---|---|---|---|
| PbTe micro(1) | 750 | 127/2 | 325 mesh | 7.69 | 1.77 ± 0.11 | 263 | 18203 | 0.0012578 | 300 | 0.21 |
| PbTe micro(2) | 825 | 127/5 | 325 mesh | 8.27 | 1.84 ± 0.13 | 217 | 25615 | 0.0012008 | 300 | 0.20 |
| PbTe nano | 800 | 127/5 | 30-35 nm | 7.94 | 1.66 ± 0.08 | 155 | 15470 | 0.0010840 | 300 | 0.20 |

Figure 6:
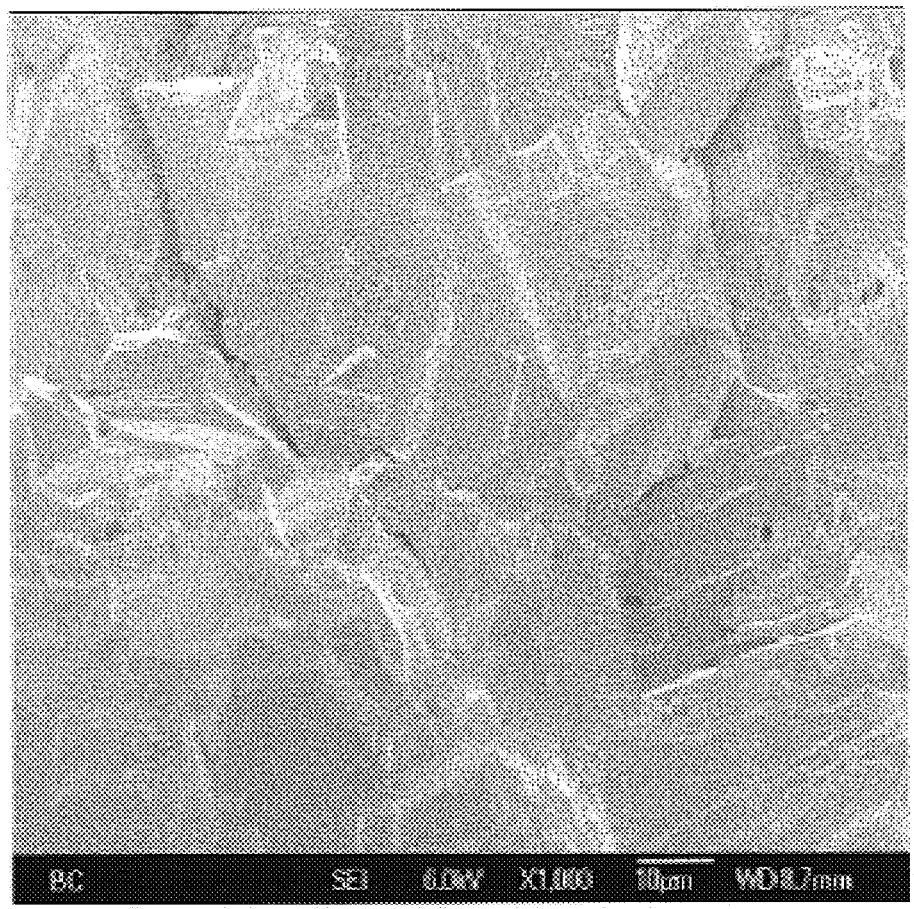
FIG. 6 is an SEM image of an exemplary thermoelectric composition generated via plasma compactification of prototype PbTe nanocrstals synthesized in accordance with one embodiment of the invention.

It should be understood that the above data is provided for illustrative purposes only and is not intended to indicate the optimal thermoelectric properties of compositions that can be prepared from PbTe nanoparticles synthesized in accordance with the teachings of the invention. For example, the above data does not show enhancement of the thermoelectric figure-of-merit of the sample formed of the PbTe nanoparticles relative to the samples formed of PbTe microparticles. This is likely due to grain growth in the nanopowder sample during the hot press process. In fact, a scanning electron microscope (SEM) image (shown in FIG. 6) of the sample formed from PbTe nanocrystals by the above hot press process shows grains comparable in size to those observed in a sample formed from PbTe microcrystals by hot press. This observed grain growth is likely due to the high temperature utilized for the hot press. Performing the hot press at lower temperatures (e.g., in a range of about 300° C. to about 700° C.) but at a much higher pressure (e.g., in a range of about 200 to about 1000 MPa) can significantly improve the figure-of-merit of the resultant compositions, e.g., a ZT of about 2 can be achieved.

In another synthesis example in accordance with an embodiment of the invention, PbSe nanoparticles were prepared by employing the following steps. A solution containing 50 mg of a surfactant (PEG) in 50 mL of water was prepared. One gram of NaOH pellets, 1 mMol of selenium (Se) powder, and 1 mMol of lead acetate were dissolved in the solution. This was followed by adding 13 mL of hydrazine hydrate to the solution and sealing it in a plastic bottle. After about 24 hours of reaction at room temperature (about 25° C.), the resulting reaction product was centrifuged, washed several times with distilled water and a black precipitate containing PbSe nanoparticles was collected. The precipitate was dried under vacuum at a temperature of about 60° C. for a few hours and the resultant product was packed inside a Glove Box under an argon environment.

Figure 7A:
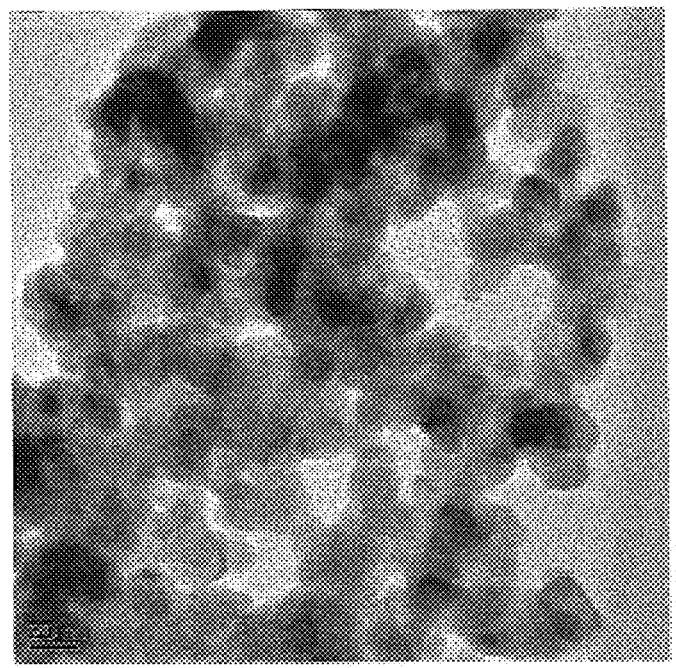
FIG. 7A-7B are low magnification TEM images of prototype PbSe nanoparticles synthesized in accordance with one embodiment of the invention.
Figure 7B:
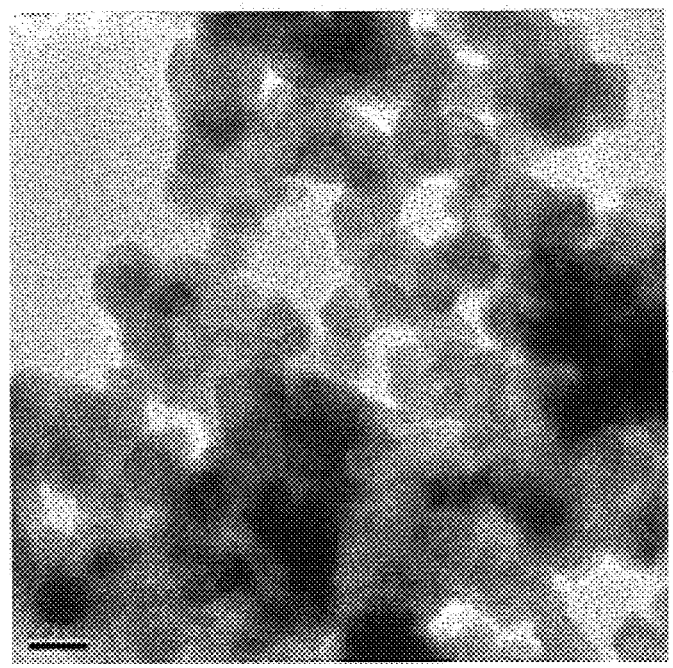
Figure 8A:
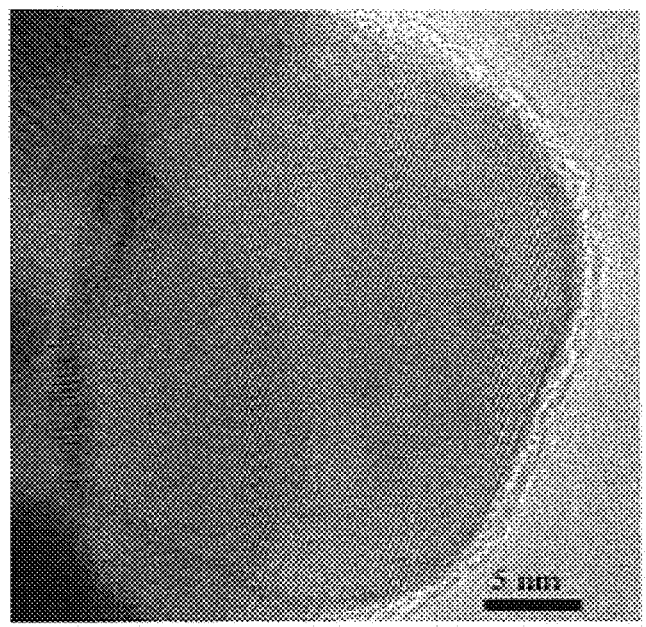
FIG. 8A-8D are high resolution TEM images of the prototype PbSe nanoparticles whose low magnification TEM images are shown in FIGS. 7A-7B.
Figure 8B:
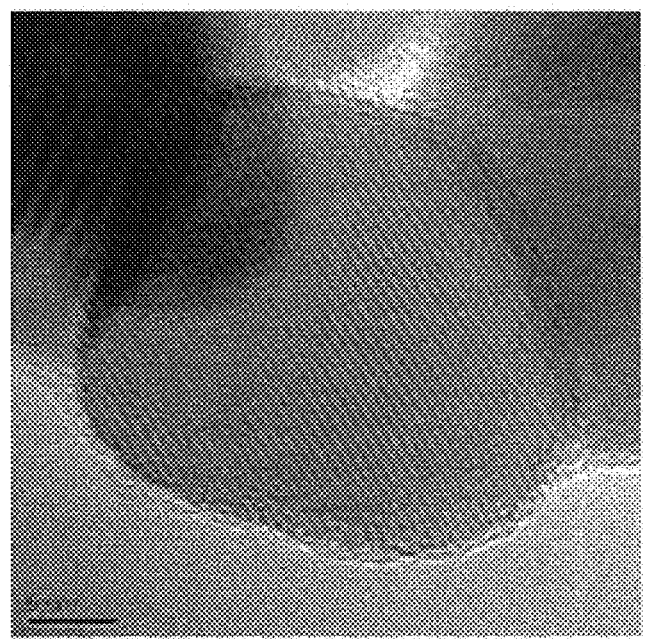
Figure 8C:
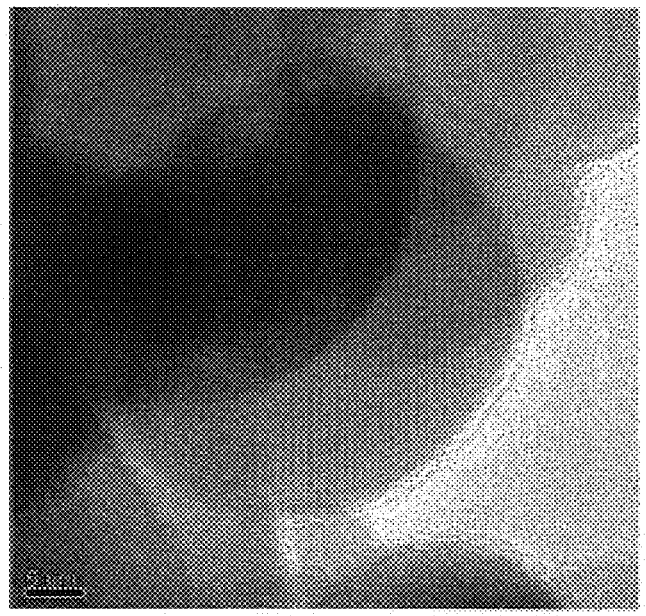
Figure 8D:
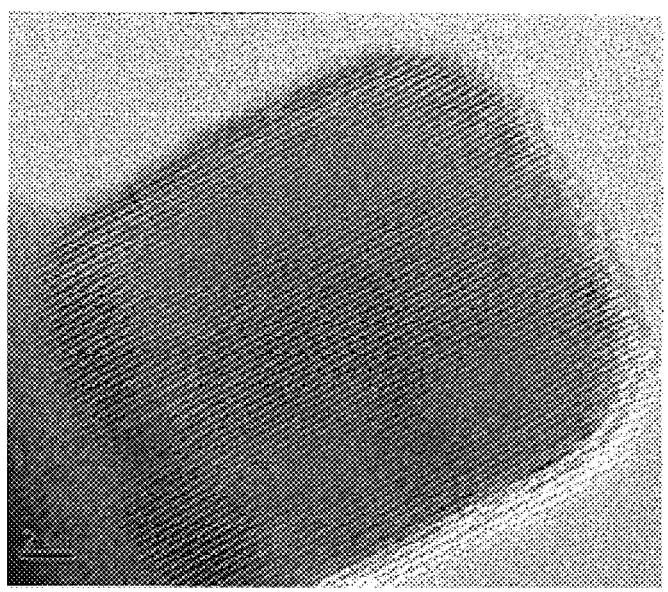
Figure 9:
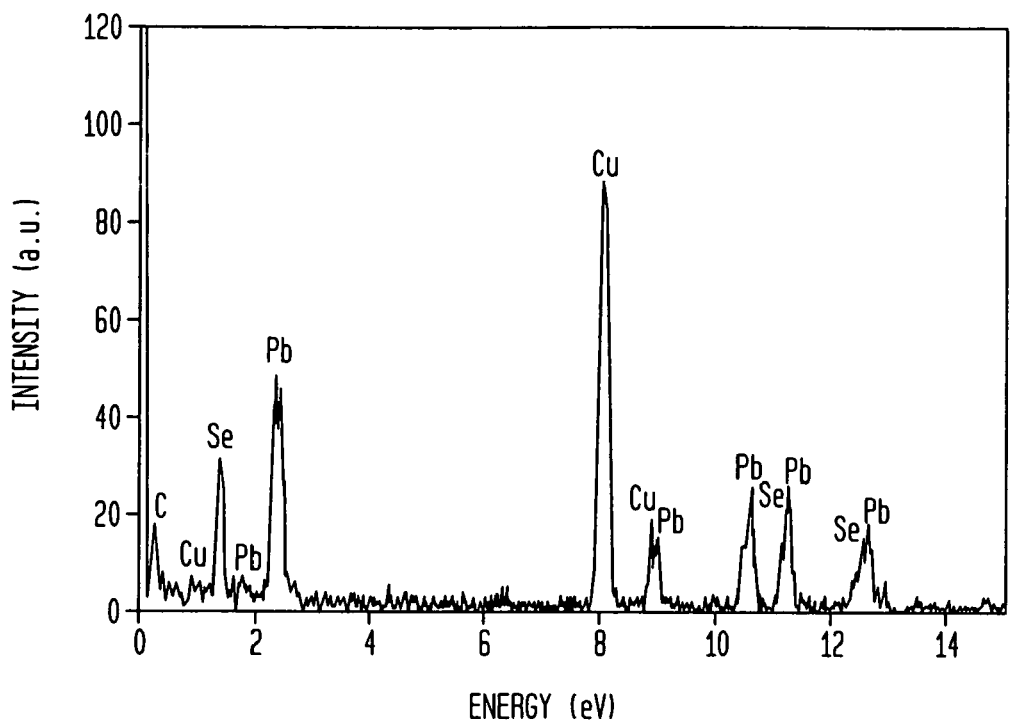
FIG. 9 is an energy dispersed X-ray spectrum of prototype PbSe nanoparticles synthesized in accordance with one embodiment of the invention.
Figure 10:
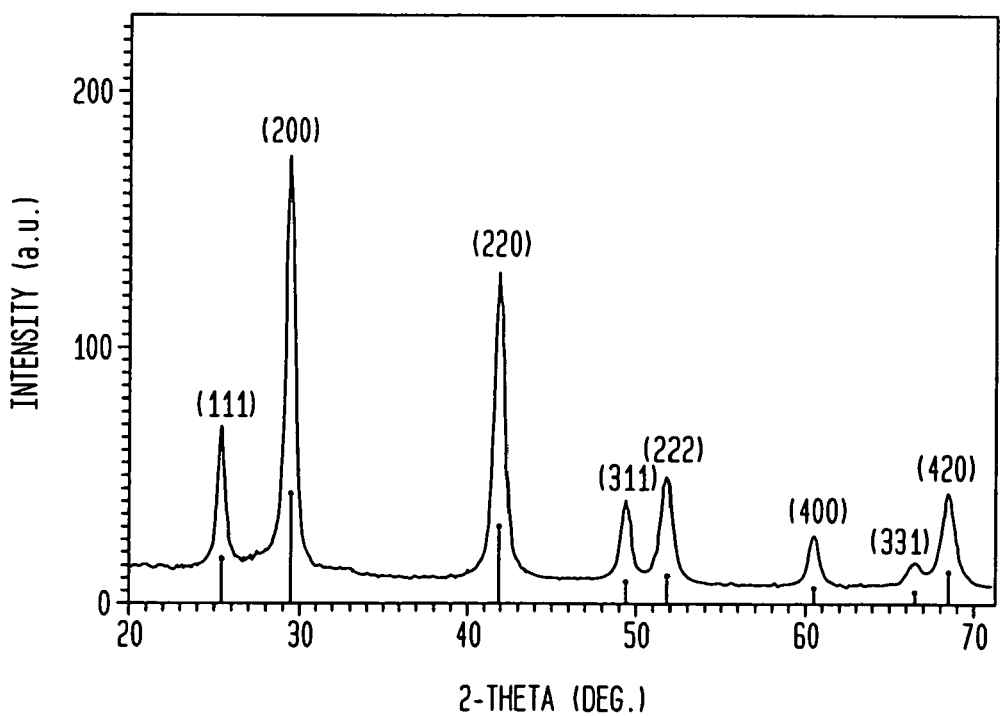
FIG. 10 is an X-ray diffraction spectrum of the prototype PbSe nanoparticles formed in accordance with the teachings of one embodiment of the invention.

FIGS. 7A and 7B show low magnification TEM images of the synthesized PbSe nanoparticles, indicating an average particle size of about 20 nm. FIGS. 8A-8D are high resolution TEM images of the PbSe nanoparticles, illustrating that the nanoparticles exhibit highly crystallized structures and various morphologies. An energy dispersed X-ray (EDX) spectrum of the synthesized nanoparticles, illustrated in FIG. 9, shows that the atomic percentage of Pb relative to Se is close to 1:1, thus verifying that the nanoparticles in fact have a PbSe composition. Further, an X-ray diffraction (XRD) spectrum of the synthesized nanoparticles, presented in FIG. 10, shows that all of the observed peaks can be indexed to a PbSe FCC structure with a lattice constant of a=0.612 nm. The absence of peaks in the XRD spectrum corresponding to other phases indicates the high purity of the nanoparticles.

Figure 11:
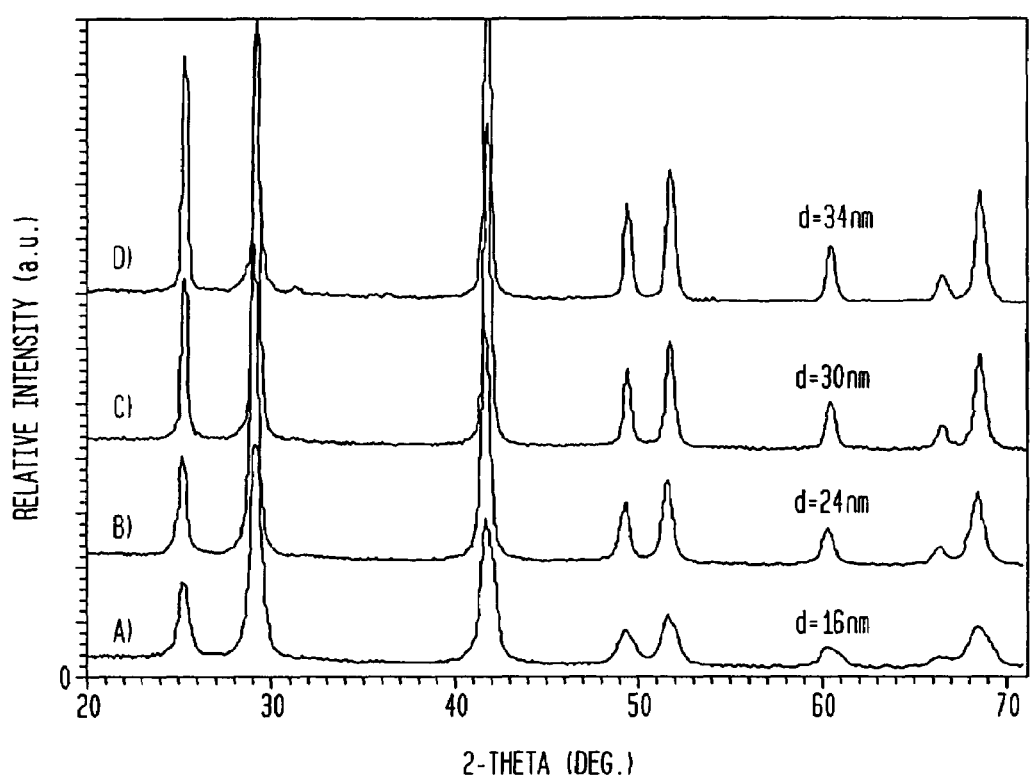
FIG. 11 presents a plurality of X-ray diffraction spectra of different sets of PbSe nanoparticles synthesized under varying conditions in accordance with the teachings of the invention.
Figure 12A:
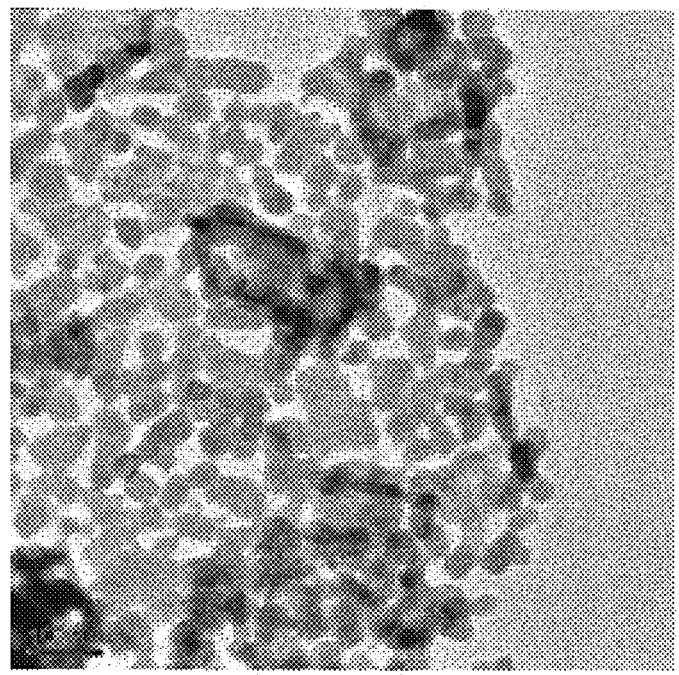
FIGS. 12A and 12B present low magnification TEM images of PbSe nanoparticles prepared in accordance with one embodiment of the invention by utilizing a surfactant and a reaction temperature of about 100° C.
Figure 12B:
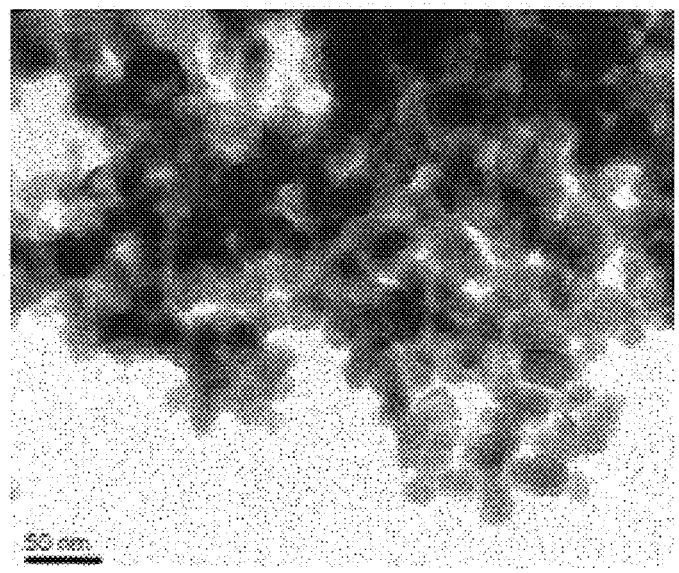

An average particle size of about 20 nm was calculated for the PbSe nanoparticles by employing the Debye-Scherrer formula and the XRD spectrum, which is consistent with the average particle size that can be derived by utilizing the TEM images. It was discovered that various reaction parameters, such as temperature, reaction time and the base concentration, could be adjusted to vary the average particle size and the particle morphology. For example, reducing the reaction time from about 24 hours to about 6 hours in conjunction with doubling the concentration of NaOH (utilizing 2 grams of NaOH) while keeping the other parameters unchanged resulted in PbSe nanoparticles having an average diameter of about 16 nm. Increasing the reaction time to about 48 hours resulted in an increase of the average particle size to about 24 nm. The reaction temperature was also observed to have an impact on the particle morphology. For example, PbSe nanoparticles prepared at a reaction temperature of about 100° C. with a lower amount of hydrazine hydrate (4 mL in 50 mL of water) exhibited an average diameter of about 30 nm when surfactant was utilized in the reaction, and an average diameter of about 35 nm when surfactant was not utilized. FIG. 11 presents XRD spectra of the PbSe nanoparticles prepared under the above varying conditions. In addition, FIGS. 12A and 12B present low magnification TEM images of PbSe nanoparticles prepared in the presence of surfactant at a reaction temperature of about 100° C., showing larger particle sizes consistent with the corresponding XRD pattern of FIG. 11.

Similar to the previous example, the PbSe nanopowder was densified at a high temperature (700-900° C.) by employing a plasma pressure compaction procedure to obtain a thermoelectric composition in the form of pellets. The pellets were then cut into appropriate sizes for performing thermoelectric measurements, as discussed in more detail below.

Table 2 below summarizes the thermoelectric properties of two PbSe samples, one obtained by compacting PbSe nanocrystals, synthesized in accordance with the teachings of the invention, and another obtained by compacting commercially obtained PbSe microcrystals.

TABLE 2

| Sample | Hot Pressed Temp (C.) | Holding Pressure (MPa) Time (min) | Particle Size | Density (g/cm$^3$) | Thermal Cond.(W/mK) | Seebeck Coeff. (μV/K) | Electrical Cond. (S/m) | Power Factor | Temp (K) | ZT |
|---|---|---|---|---|---|---|---|---|---|---|
| PbSe micro | 850 | 127/2 | 325 mesh | 8.2 | 1.63 ± 0.10 | 141 | 78790 | 0.001562 | 300 | 0.29 |
| PbSe nano | 750 | 100/5 | about 20 nm | 7.8 | 1.7 | 192 | 55100 | 0.002034 | 300 | 0.36 |

The data shows that the figure-of-merit of the sample prepared by utilizing PbSe nanocrystals shows a slight enhancement relative to that of the sample prepared from PbSe microcrystals. It should, however, be understood that this data is only for illustrative purposes and is not intended to indicate an optimal thermoelectric figure-of-merit of a composition formed of PbSe nanocrystals synthesized in accordance with the teachings of the invention. For example, further optimization of the compaction process, e.g., performing it at a lower temperature but at a much higher pressure (e.g., 1000 MPa), can result in additional enhancement of the composition's figure-of-merit.

Figure 13A:
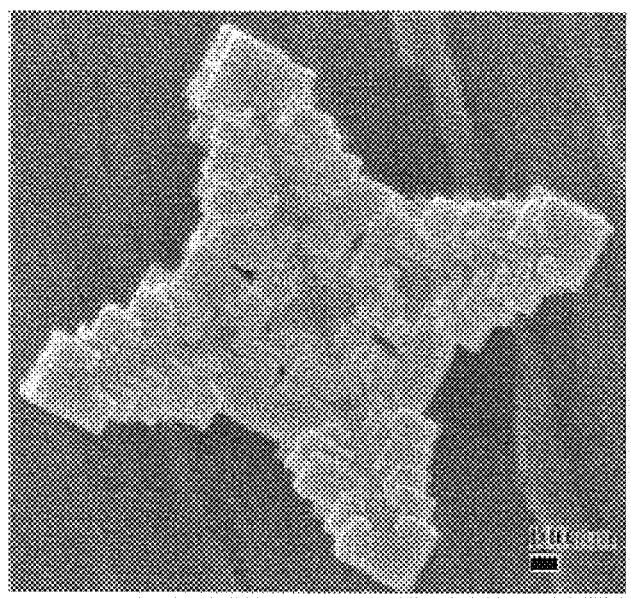
FIGS. 13A-13D show SEM images of prototype PbTe particles formed in accordance with one embodiment of the invention and having highly symmetric structures.
Figure 13B:
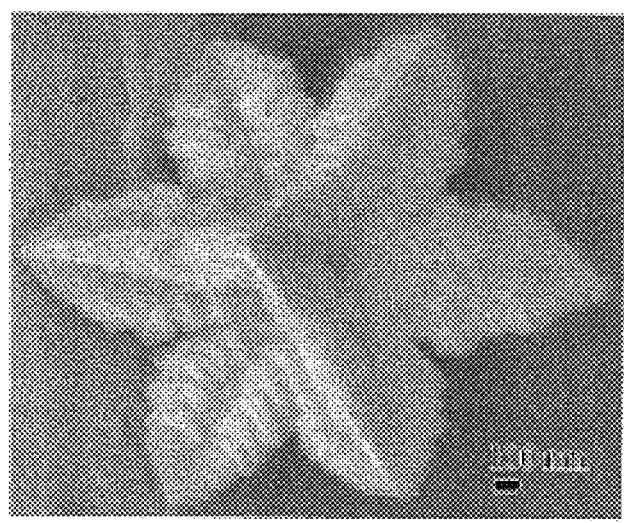
Figure 13C:
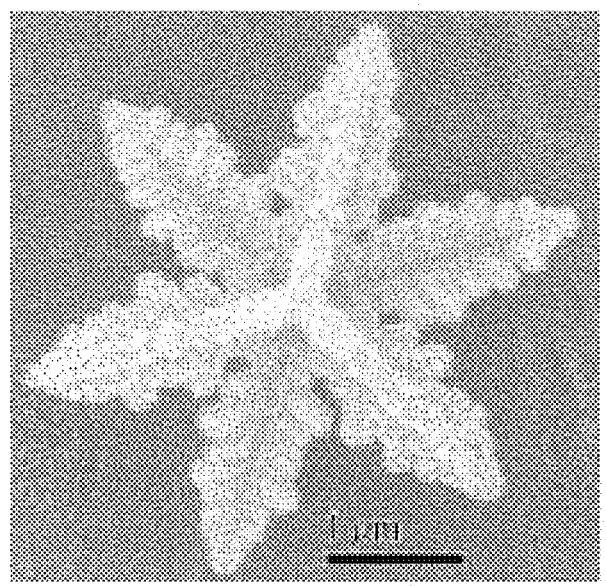
Figure 13D:
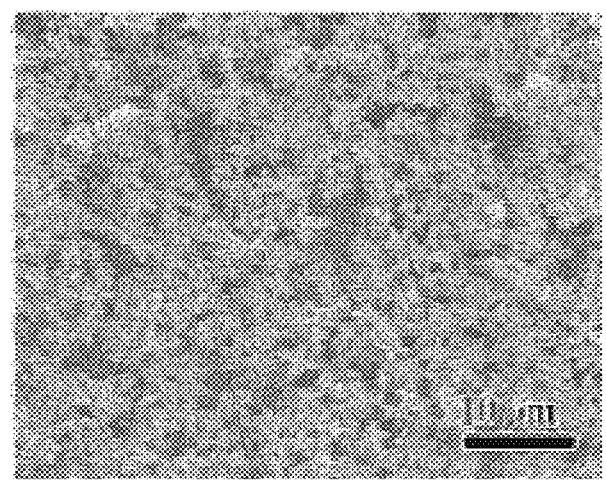

It was also discovered that PbTe and PbSe microstructures and nanostructures having a variety of morphologies, including those with a high degree of symmetry, can be synthesized by employing the above methods through adjustment of various factors, such as reaction temperature, time and relative concentrations of various reactants. By way of example, FIGS. 13A-13D show SEM images of PbTe highly symmetric nanostructures, herein referred to as microflowers, synthesized in accordance with one embodiment of the invention. FIG. 13B is an SEM image of the same microflower as that shown in FIG. 13A but tilted at 45 degrees and FIG. 13C is an SEM image of another microflower viewed along a corner thereof, demonstrating 8 corners and 4-fold in-plane symmetry. In a typical synthesis of PbTe microflowers, 50 mg of PEG and 2.4 g of NaOH were added to 50 mL of de-ionized water. After a few minutes of stirring, 1 mMol of $NaTeO_3$ and 1 mMol of PbAc (lead acetate trihydrate) were added to the solution and stirred until the reactants were dissolved. Finally, about 10 mL of hydrazine hydrate was added to the solution and the solution was transferred to a Teflon-lined autoclave. The autoclave was sealed and kept in a furnace at a temperature of about 160° C. for about 10 hours, and subsequently cooled down to room temperature. The resultant reaction product was washed several times with water to remove unwanted byproducts from the synthesized PbTe nanostructures.

A similar synthetic method, in which $NaTeO_3$ was replaced with $NaSeO_3$, was followed—albeit at a lower temperature of about 100° C.—to prepare PbSe microflowers.

Figure 14A:
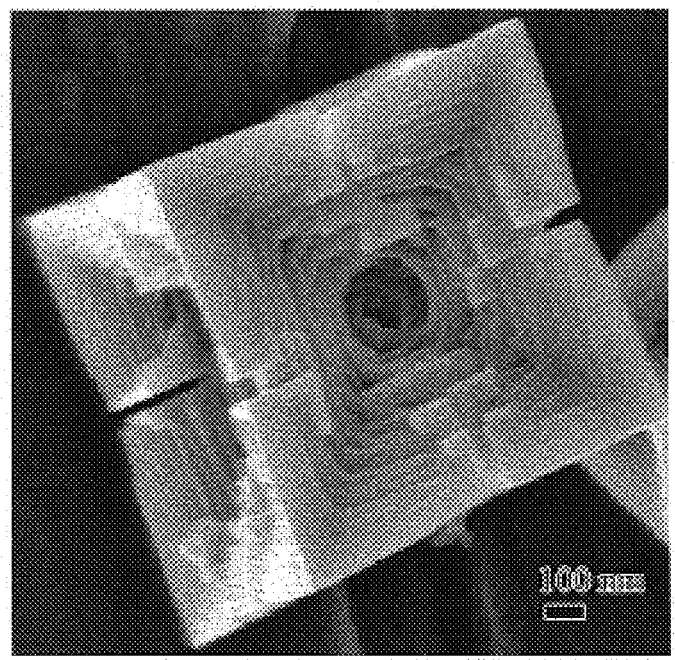
FIGS. 14A-14D show SEM images of prototype PbTe particles obtained by employing a hydrothermal synthesis method according to one embodiment of the invention performed at a reaction temperature of about 125° C.
Figure 14B:
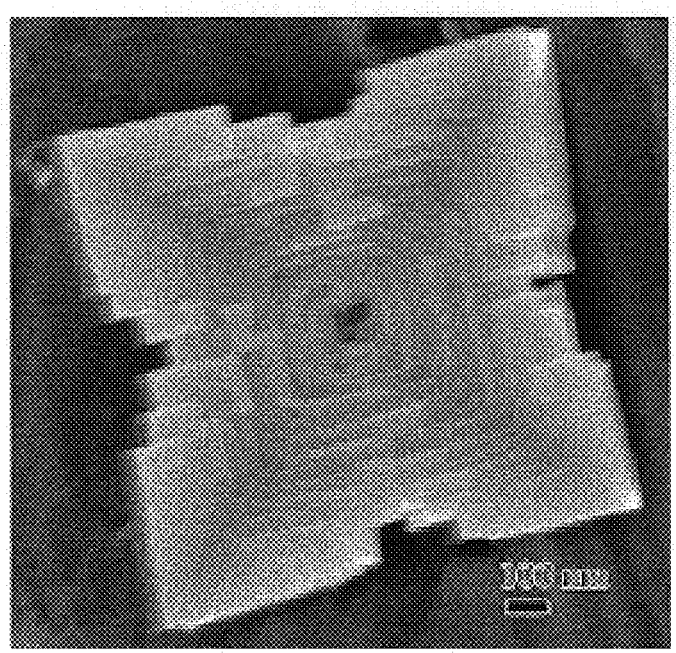
Figure 14C:
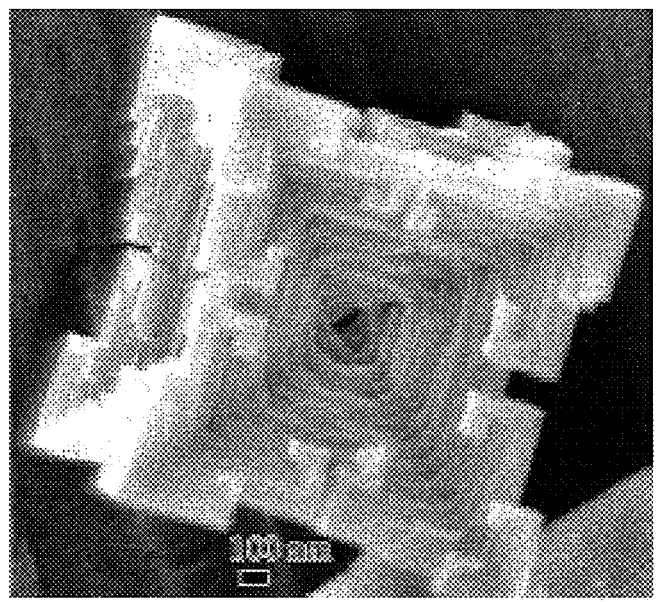
Figure 14D:
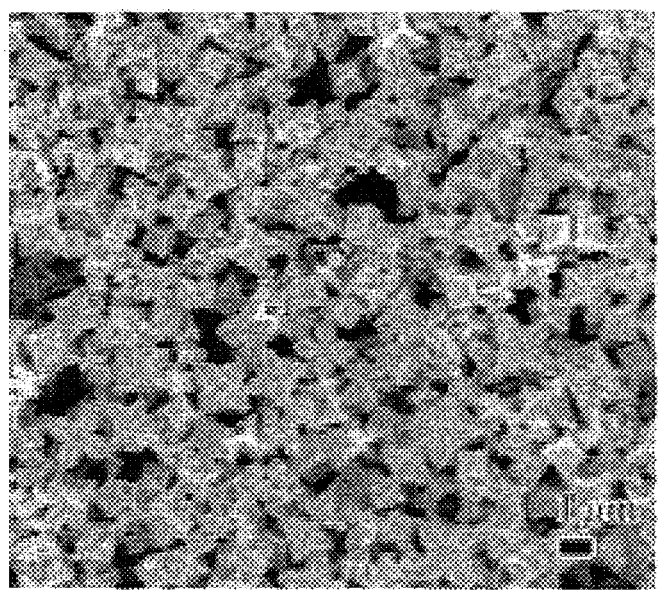
Figure 15A:
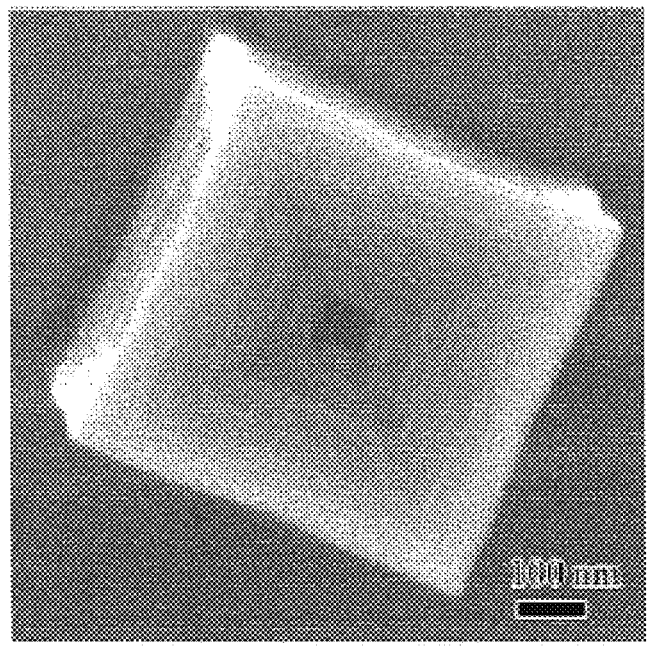
FIGS. 15A and 15B show SEM images of PbTe hollow nanoboxes formed in accordance with the teachings of one embodiment of the invention.
Figure 15B:
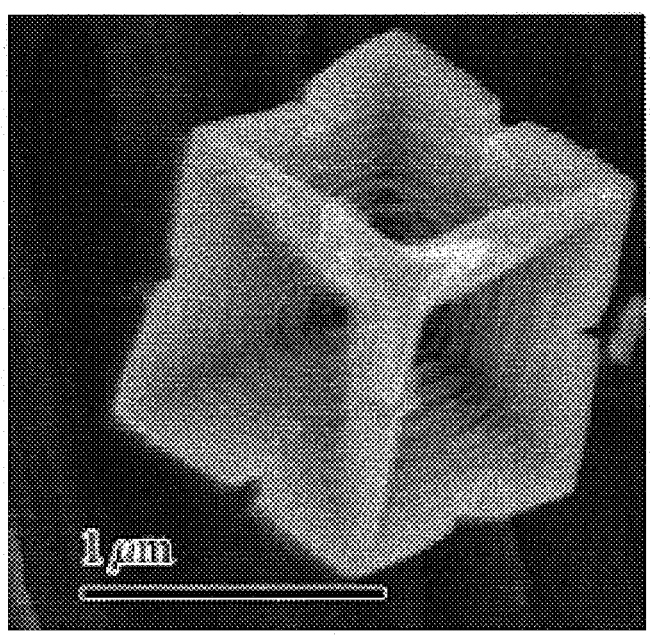

FIGS. 14A-14C present SEM images of prototype PbTe nanoparticles obtained by utilizing the above hydrothermal synthesis approach but at a lower reaction temperature of about 125° C., illustrating a morphology at an earlier stage of development than the microflower morphology discussed above. Further reducing the reaction temperature to about 100° C. can result in formation of PbTe hollow nanoboxes, as the SEM images of FIGS. 15A and 15B show, having sizes in a range of about 100 nm to about 1000 nm. With further decrease of the reaction temperature to about 85° C., PbTe nanoparticles having substantially cubic morphologies and having sizes in range of about 10 to about 50 nm (an average dimension of about 30 nm) were obtained.

Figure 16:
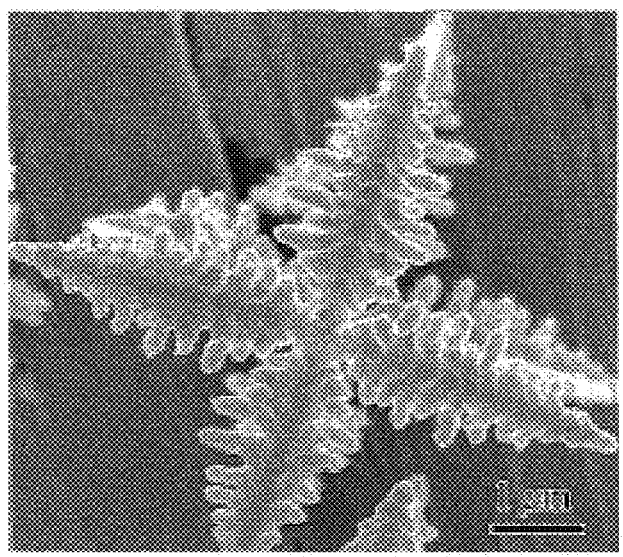
FIG. 16 shows an SEM image of a PbTe microflower synthesized in accordance with one embodiment of the invention exhibiting secondary growth at its tips.

The above examples indicate that the morphologies of the nano and microstructured can be controlled by adjusting the reaction temperature. It was observed that increasing the reaction temperature to about 185 C resulted in secondary growths on the tips of microflowers, as shown by the SEM image of FIG. 16, while substantially preserving the microflower morphology and size. Similar morphologies can be produced by utilizing other sources of Te, such as $TeCl_4$.

Moreover, similar morphologies of PbSe micro and nanostructures can be observed by adjusting the reaction temperature, albeit at temperatures lower than those employed for synthesizing the PbTe structures. For example, PbSe microflowers were obtained at a reaction temperature of about 100° C. and PbSe nanocubes having average dimensions of about 30 nm were obtained at reaction temperatures close to room temperature (e.g., 300° K.).

The concentration of the surfactant can also play a role in determining the morphology of the synthesized micro and nanostructures. For example, in the absence of the PEG surfactant in the above exemplary synthesis, no hollow box morphology was observed. Rather, micro-sized solid cubic particles were produced. Without being limited to any particular theory, at sufficiently low temperatures (e.g., in a range of about 20° C. to about 200° C.), nanocubes are typically produced due to the stabilization effects of the surfactant. At higher temperatures of about 80° C., generally cubic nanparticles can first grow to a critical size determined by specific energy and Gibbs free energy, which are dependent on the reaction conditions. Due to the steric stabilization effect of the surfactant, the cubic nanoparticles can then act as nucleation particles to allow the growth of secondary layers from their corners at which the surfactant concentration is lower.

Figure 17:
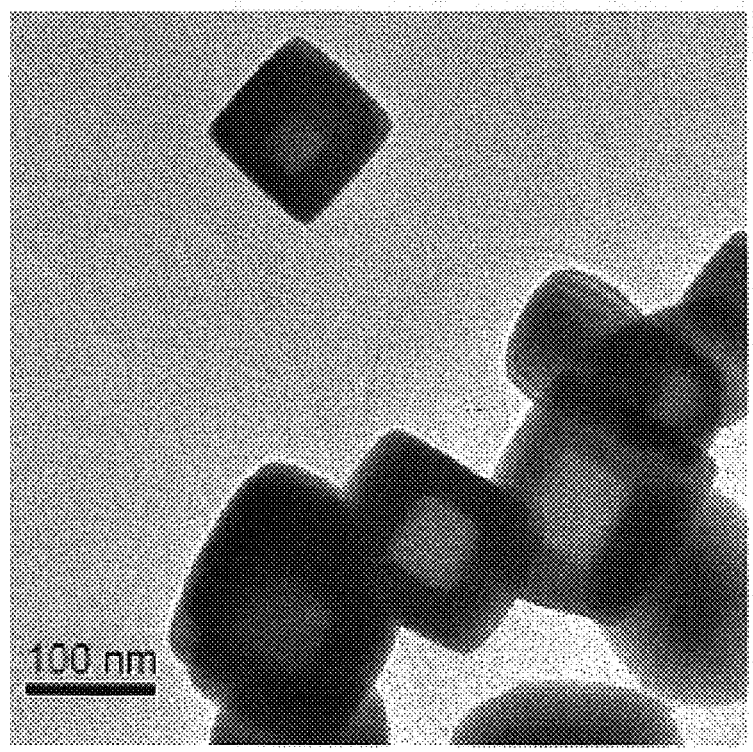
FIG. 17 shows a TEM image of PbTe nanocrystals prepared in accordance with one embodiment of the invention by employing a solvent comprising a high volume ratio of ethanol to water, FIG. 18 schematically illustrates a possible mechanism for formation of PbTe nanoboxes in accordance with one embodiment of the invention, FIG. 19 schematically illustrates a IV-VI nanoparticle according to one embodiment of the invention that includes metallic domains.

In some embodiments, a mixture of ethanol and water can be utilized as the solvent, together with a surfactant, in the above synthetic methods to generate Group IV-VI nanocrystals having regular cubic shapes and hollow interiors. For example, FIG. 17 shows a TEM image of PbTe nanocrystals prepared by employing a high volume ratio of ethanol to water (e.g., a volume ratio of 8 to 1). These nanocrystals show a regular cubic shape with an edge length of about 80 to about 180 nm. A strong contrast observed between the dark edges and the bright center indicates a hollow interior and a wall thickness of about 40 nm. Reducing the volume ratio of ethanol to water (e.g., down to 1 to 1) resulted in obtaining a mixture of solid and hollow nanocrystals with irregular shapes.

Figure 18:
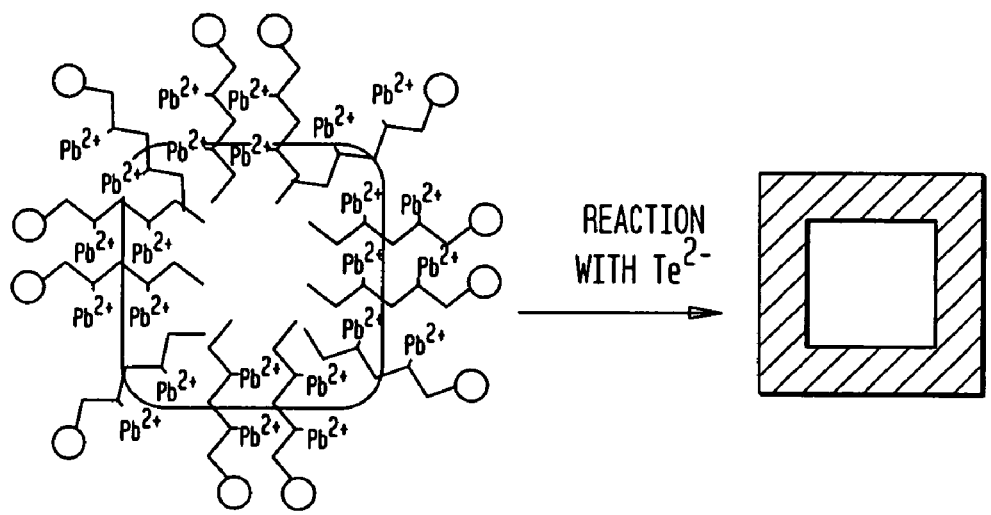

The above illustrative examples show that both the surfactant and the volume ratio of ethanol to water can play a role in formation of nanoboxes. Without being limited to any particular theory, a possible mechanism for formation of the above PbTe nanoboxes, shown schematically in FIG. 18, can be understood as follows. Upon dissolution in water, the PEG surfactant molecules aggregate into structures called micelles in which the polar hydrophilic heads of the chain-like surfactant molecules are exposed to water and their hydrophobic hydrocarbon chains are substantially protected from contact with water. In addition, the presence of a large amount of activated oxygen in PEG molecular chains can result in strong interactions between PEG and metal ions. For example, $Pb^{2+}$-PEG chain structures can be formed when PEG and $Pb^{2+}$ are mixed together in a solvent. Upon gradual dissolution of Te particles in the solvent, they form $Te^{2-}$ ions that can react with $Pb^{2+}$ to form hollow cubic PbTe nanoboxes with micelles acting as templates and the surfactant PEG and their respective counter-ions being selectively adsorbed on the PbTe crystal faces.

Figure 19:
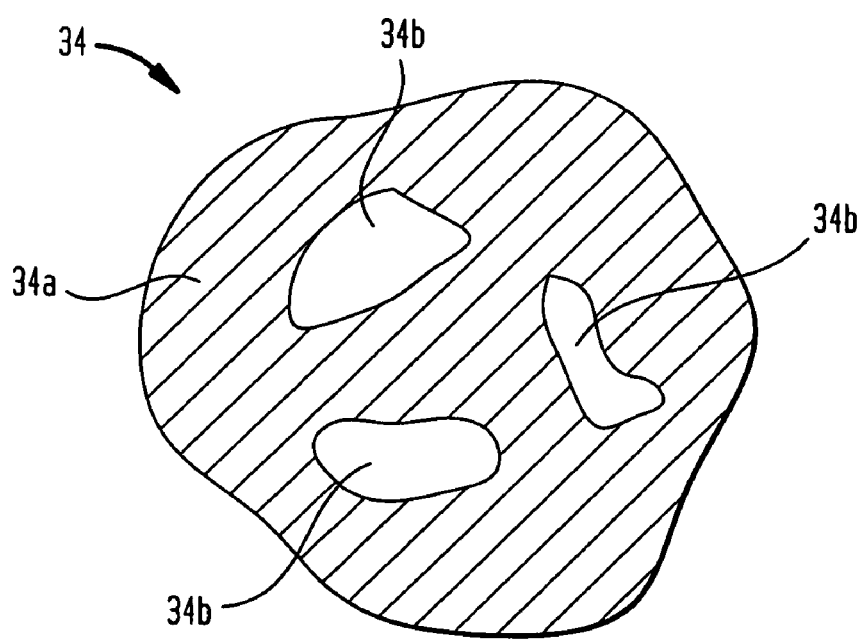

In another aspect, the invention provides thermoelectric compositions, and methods for their synthesis, that include nanoparticles formed as a Group IV-Group VI alloy, such as PbTe or PbSe, and having a metallic dopant, such as copper or silver, dispersed through the alloy portion. The metallic dopant atoms can be uniformly distributed within the IV-VI alloy. Alternatively or in addition, in some embodiments, the dopant atoms can form metallic domains distributed, e.g., non-uniformly, through the nanoparticle. By way of example, FIG. 19 schematically illustrates an irregularly-shaped nanoparticle 34 having a portion 34a formed of a Group IV-Group VI alloy (e.g., PbTe or PbSe) and a plurality of metallic domains 34b (e.g., silver or copper domains) surrounded by the alloy portion 34. The metallic domains are typically non-uniformly distributed within the nanoparticle. In some embodiment, the portion 34 can also include the metallic dopant atoms forming chemical bonds with one or more of the alloy's atomic constituents. The particle 34 can have a size (e.g., characterized by its largest dimension) in a range of about a few nanometers to about 1000 nanometers, e.g., in a range of about 10 nm to about 200 nm or in a range of about 5 nm to about 100 nm.

In some embodiments, the metallic dopant has an atomic concentration of less than about 30 percent relative to the alloy portion of the nanoparticle. For example, the dopant's relative atomic concentration can be in a range of about 1 percent to about 20 percent.

Without being limited to any particular theory, the interface boundaries between the metallic domains and the alloy portions of the nanoparticles can result in an increase in phonon scattering. However, the incorporation of metallic domains within the alloy portions of the nanoparticles does not substantially degrade their electron transport properties, and in some cases enhances these properties. The enhanced phonon scattering, together with substantially unchanged (or enhanced) electron transport properties, can result in improved thermoelectric properties of compositions formed of the doped nanoparticles.

Figure 20:
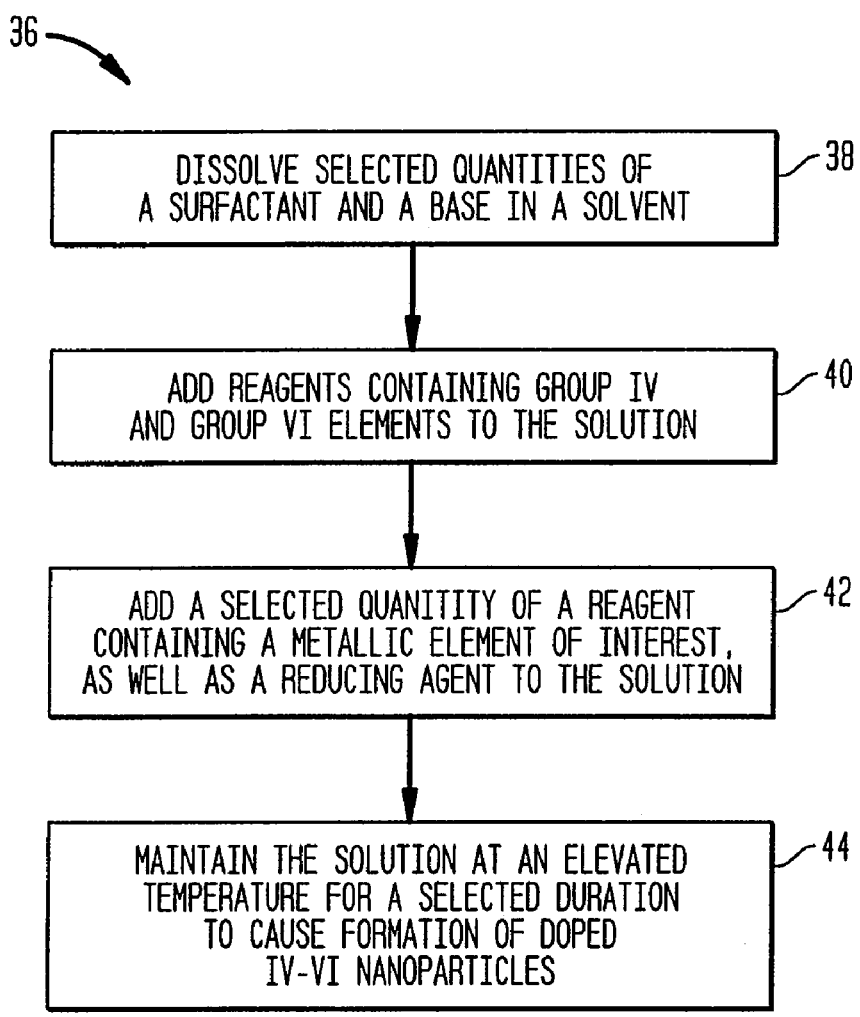
FIG. 20 is a flow chart depicting various steps in a method of synthesizing metal-doped IV-VI nanoparticles in accordance with one embodiment of the invention.

With reference to a flow chart 36 of FIG. 20, in an exemplary method for synthesizing the doped nanoparticles described above, in a step 38, selected quantities of a surfactant (e.g., PEG) and a base (e.g., NaOH) are dissolved in a solvent, such as water. This can be followed by adding reagents containing Group IV and Group VI elements to the solution (step 40). A selected quantity of a reagent containing a metallic element of interest (e.g., silver or copper), as well as a reducing agent can then be added to the solution (step 42). In step 44, the solution can be kept at an elevated temperature, e.g., a temperature in a range of about 20° C. to about 360° C., for a duration in a range of about 1 hour to about 50 hours (e.g., in a range of about 5 hours and about 20 hours) to cause formation of nanoparticles doped with the metallic element. After the reaction, the resulting product can be washed, e.g., with distilled water and ethanol, to remove impurities, dried, e.g., in vacuum at a temperature of about 60° C., and packed under an inert atmosphere.

Similar to the previous embodiments, the synthesized doped nanoparticles can be densified by employing a plasma pressure compaction technique, such as that described above.

To further elucidate the efficacy of the above method for synthesizing metallically doped nanoparticles and only for illustrative purposes, prototype nanoparticles doped with silver or copper were synthesized, as discussed in more detail below. For example, $Ag_x(PbTe)_{1-x}$ nanocrystals were synthesized by dissolving about 50 mg of PEG and 2.4 grams of NaOH in about 50 mL of water. Subsequently, about 1 mMol of Te powder and about 350 mg of lead acetate were added to the solution and stirred for about 10 minutes. This was followed by adding about 9 mg of silver acetate and 5 mL of hydrazine hydrate to the solution. The resultant solution was then quickly transferred into a Teflon-lined autoclave and sealed. The solution was kept in a furnace at a temperature of about 205° C. for about 20 hours. Subsequently, the reaction product was washed with water and absolute ethanol several times to remove any impurities, dried in a furnace at 60° C. under vacuum for a few hours, and packed in a Glove Box under an inert atmosphere.

Figure 21A:
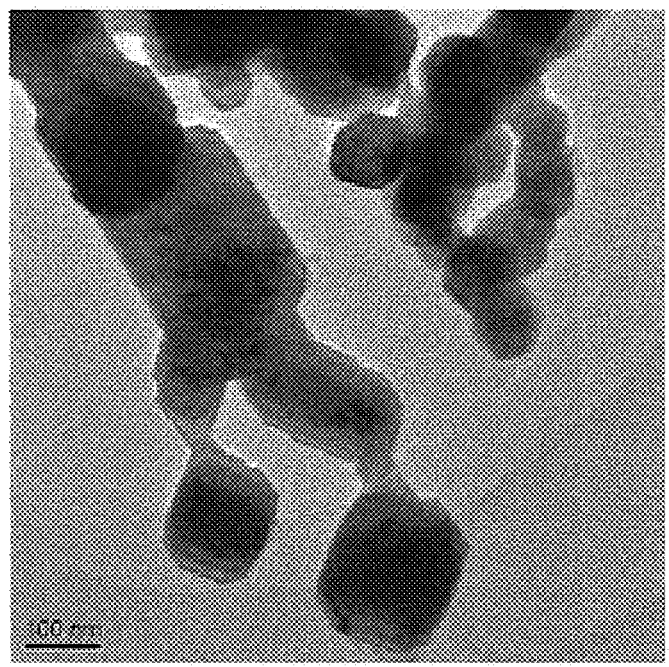
FIGS. 21A and 21B show, respectively, low and high resolution TEM images of prototype $Ag_x(PbTe)_{1-x}$ nanocrystals synthesized by employing the method depicted in the flow chart of FIG. 20.
Figure 21B:
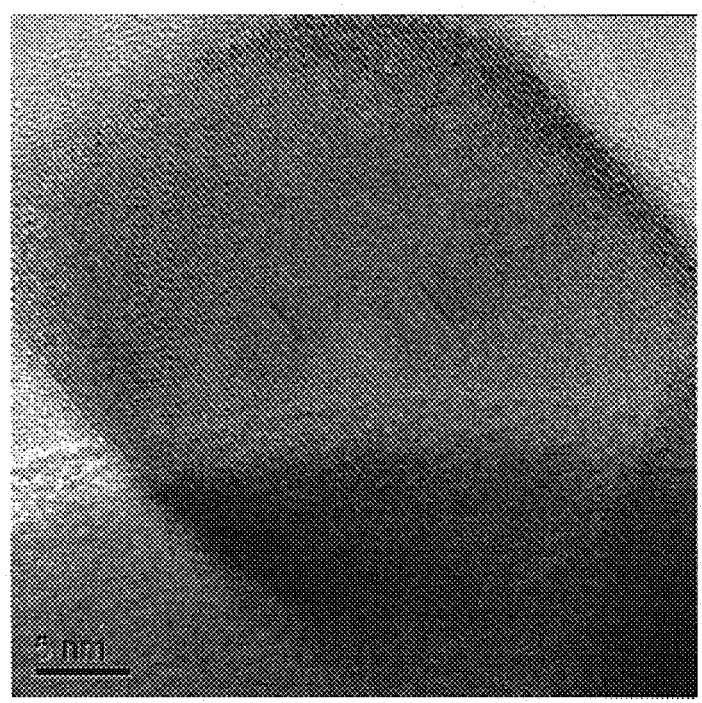
Figure 22:
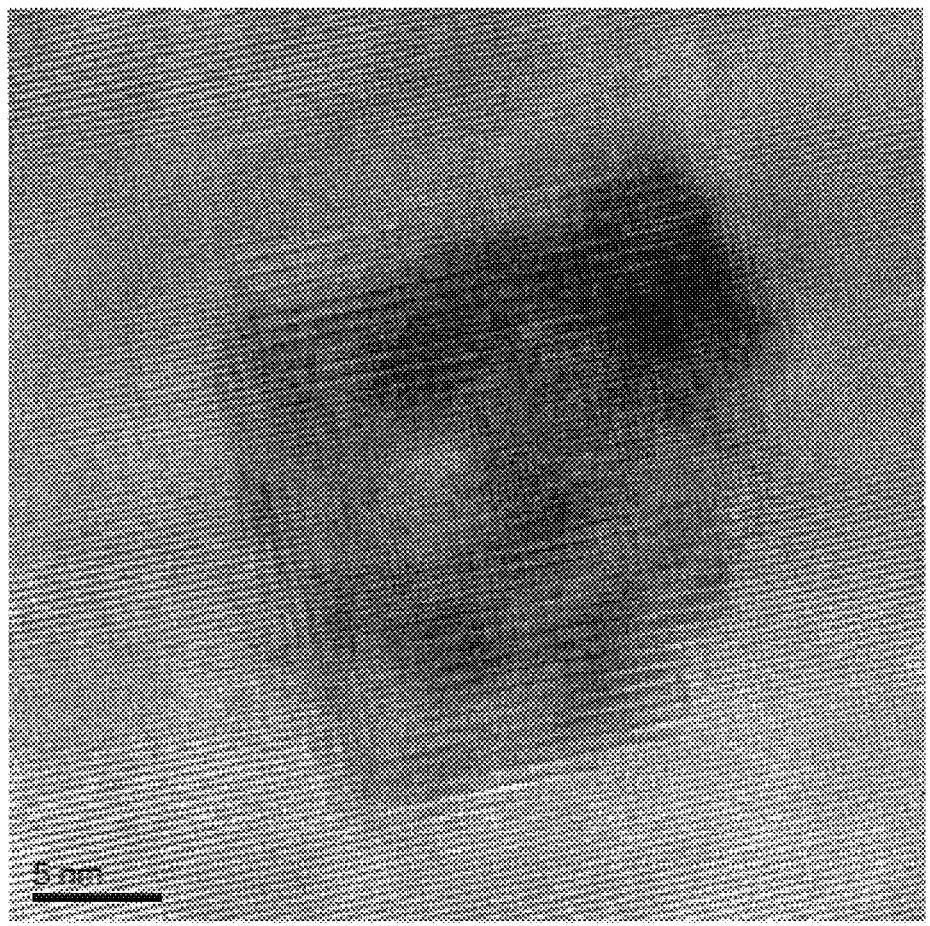
FIG. 22 shows a high resolution TEM image of a silver-doped nanocrystal synthesized in accordance with the teachings of the invention.

FIGS. 21A and 21B show, respectively, low and high resolution TEM images of prototype $Ag_x(PbTe)_{1-x}$ nanocrystals synthesized by utilizing the above synthesis method. An energy dispersed X-ray (EDX) study showed that the atomic composition of the nanocrystals can be characterized by $Ag_{0.2}(PbTe)_{0.98}$. In some of the nanocrystals, the silver dopants form domains having sizes of a few nanometers, as a high resolution TEM image of one such silver-doped nanocrystal presented in FIG. 22 shows. As noted above, such domains can advantageously improve the figure-of-merit of thermoelectric compositions formed from such nanocrystals, for example, by enhancing phonon scattering and providing a high electrical conductivity.

The metallic dopants suitable for use in the practice of the invention are not limited to silver. By way of another example, nanocrystals doped with copper were synthesized in a manner similar to that employed for preparation of silver-doped nanocrystals. More specifically, the same synthetic steps as those described above were followed but rather than employing silver acetate, 11 mg of copper acetate monohydrate was used as a source of copper and a reaction temperature of about 200° C. was utilized.

Figure 23A:
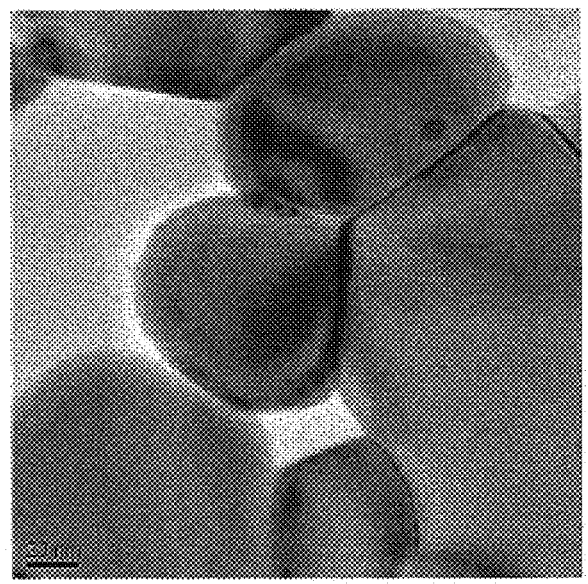
FIG. 23A and 23B present, respectively, low and high resolution TEM images of $Cu_x(PbTe)_{1-x}$ nanocrystals uniformly doped with copper synthesized in accordance with the teachings of one embodiment of the invention.
Figure 23B:
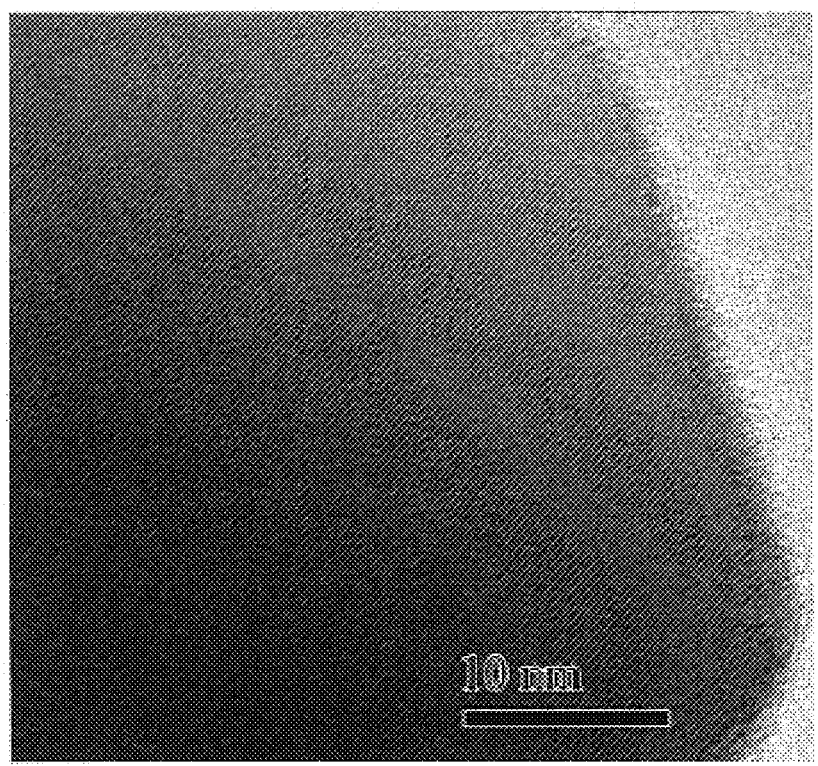
Figure 24A:
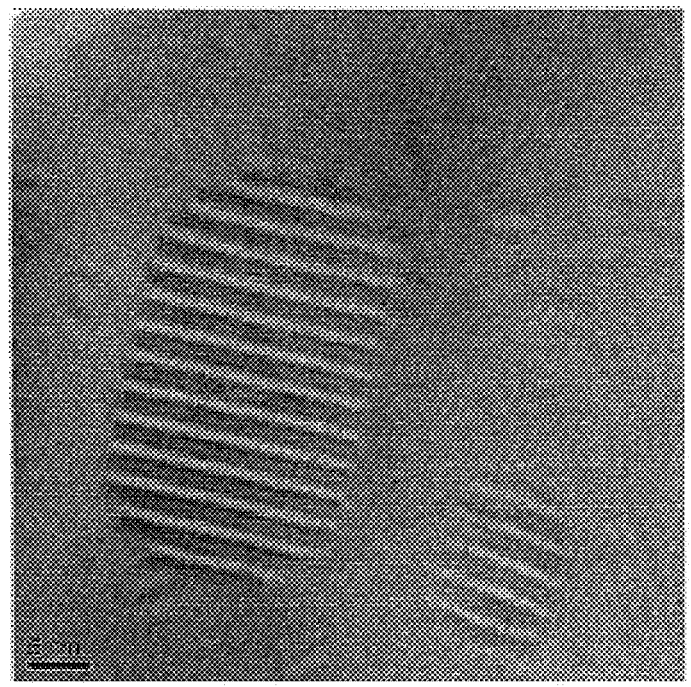
FIGS. 24A and 24B present high resolution TEM images of some $Cu_x(PbTe)_{1-x}$ formed in accordance with the teachings of the invention that include small copper domains.
Figure 24B:
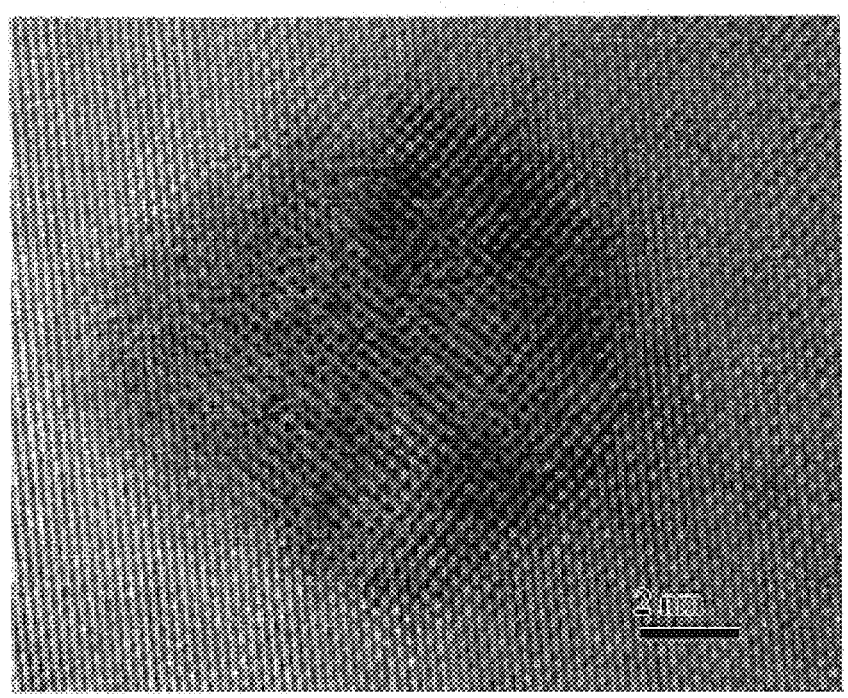

FIGS. 23A and 23B present, respectively, low and high resolution TEM images of $Cu_x(PbTe)_{1-x}$ nanocrystals uniformly doped with copper. FIGS. 24A and 24B present high resolution TEM images of some of these nanocrystals, indicating that some copper-doped nanocrystals include small copper domains dispersed within the $Cu_x(PbTe)_{1-x}$ matrix. Similar to the silver-doped nanocrystals, these copper nanodomains also improve the figure-of-merit of thermoelectric compositions formed of the copper-doped nanocrystals.

Those having ordinary skill in the art will appreciate that various modifications can be made to the above embodiments without departing from the scope of the invention. For example, suitable reagents other that those utilized in the above exemplary embodiments can be employed in synthesizing IV-VI nanostructures in accordance with the teachings of the invention.

What is claimed is:

1. A method of synthesizing nanoparticles having a metallic dopant, comprising:
    preparing a solution containing a surfactant, a reagent containing a Group IV element, and a reagent containing a Group VI element,
    adding a selected quantity of another reagent containing a dopant metal to said solution,
    adding a reducing agent to said solution, and
    maintaining the resultant solution at an elevated temperature in a range of about 20° C. to about 360° C. for a duration in a range of about 1 hour to about 50 hours so as to generate a reaction product including nanoparticles of said Group IV and Group VI elements doped with said metal.

2. The method of claim 1, further comprising adding a selected quantity of a base to said solution so as to facilitate formation of the nanoparticles.

3. The method of claim 1, further comprising selecting said Group IV element to be Pb, Sn, and Ge.

4. The method of claim 1, further comprising selecting said Group VI element to be Se Te, and S.

5. The method of claim 1, further comprising selecting said metal to be any of silver, copper, zinc, gold, gallium, indium, thallium, tin, antimony or bismuth.

6. The method of claim 1, further comprising selecting said surfactant to be any of PEG, CTAB or tergitol NP-9.

7. The method of claim 2, further comprising selecting said base to be NaOH.

8. The method of claim 1 wherein the preparing step includes introducing a first reagent containing the Group IV element into a solution, and introducing a second reagent containing the Group VI element in said solution.

* * * * *

UNITED STATES PATENT AND TRADEMARK OFFICE
CERTIFICATE OF CORRECTION

PATENT NO. : 7,586,033 B2  Page 1 of 1
APPLICATION NO. : 11/120729
DATED : September 8, 2009
INVENTOR(S) : Zhifeng Ren et al.

It is certified that error appears in the above-identified patent and that said Letters Patent is hereby corrected as shown below:

Title Page, Item (75) Inventors: 3$^{rd}$ Inventor should read:

Shankar Kunwar, Newton, MA

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,586,033 B2  Page 1 of 1
APPLICATION NO. : 11/120729
DATED : September 8, 2009
INVENTOR(S) : Ren et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1003 days.

Signed and Sealed this

Fourteenth Day of September, 2010

David J. Kappos
*Director of the United States Patent and Trademark Office*